US009915967B2

(12) United States Patent
Moriya

(10) Patent No.: US 9,915,967 B2
(45) Date of Patent: Mar. 13, 2018

(54) CIRCUIT DEVICE AND ELECTRONIC APPARATUS

(71) Applicant: SEIKO EPSON CORPORATION, Tokyo (JP)

(72) Inventor: Isamu Moriya, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 261 days.

(21) Appl. No.: 14/611,529

(22) Filed: Feb. 2, 2015

(65) Prior Publication Data
US 2015/0234411 A1 Aug. 20, 2015

(30) Foreign Application Priority Data

Feb. 17, 2014 (JP) ................................. 2014-027439

(51) Int. Cl.
G05F 3/16 (2006.01)
H01L 27/092 (2006.01)
H01L 29/78 (2006.01)
H01L 29/08 (2006.01)
H01L 29/10 (2006.01)

(52) U.S. Cl.
CPC ............ G05F 3/16 (2013.01); H01L 27/0922 (2013.01); H01L 29/1087 (2013.01); H01L 29/0878 (2013.01); H01L 29/1083 (2013.01); H01L 29/7816 (2013.01); H01L 29/7835 (2013.01)

(58) Field of Classification Search
CPC ... G05F 3/16; H01L 29/1087; H01L 29/7816; H01L 27/0922; H01L 29/0878; H01L 29/1083; H01L 29/7835
USPC ........................................................ 323/313
See application file for complete search history.

(56) References Cited

U.S. PATENT DOCUMENTS

| 6,784,493 | B2 * | 8/2004 | Efland ................... H01L 21/761 257/347 |
| 2004/0212021 | A1 * | 10/2004 | Shimizu ................ H01L 27/088 257/375 |
| 2008/0231219 | A1 | 9/2008 | Mori et al. |
| 2009/0212356 | A1 | 8/2009 | Yamada |
| 2010/0006936 | A1 * | 1/2010 | Matsudai ............ H01L 29/1083 257/343 |
| 2013/0265086 | A1 | 10/2013 | Chang et al. |
| 2015/0236087 | A1 | 8/2015 | Chang et al. |

FOREIGN PATENT DOCUMENTS

| CN | 101277089 A | 10/2008 |
| JP | 03050762 A | 3/1991 |
| JP | 2003-189683 A | 7/2003 |
| JP | 2008-042975 A | 2/2008 |
| JP | 2009200215 A | 9/2009 |
| JP | 2013219358 | 10/2013 |

* cited by examiner

Primary Examiner — Adolf Berhane
Assistant Examiner — Afework Demisse
(74) Attorney, Agent, or Firm — Oliff PLC

(57) ABSTRACT

In order to suppress a negative influence on a circuit operation caused by variation in a substrate potential, a circuit device includes a bridge circuit having a high-side transistor and a low-side transistor, a detection circuit configured to detect current flowing in the bridge circuit, a control circuit configured to control switching on and off of the bridge circuit, and a guard region for setting a substrate PSB of the circuit device to a substrate potential.

22 Claims, 14 Drawing Sheets

CIRCUIT DEVICE AND ELECTRONIC APPARATUS

BACKGROUND

1. Technical Field

The present invention relates to a circuit device, an electronic apparatus, and the like.

2. Related Art

A method of controlling driving of a motor by controlling a chopping current is known as a motor driver that drives a DC motor. With this method, current flowing in an H bridge circuit is subjected to current-to-voltage conversion using a sense resistor, the obtained voltage is compared with a reference voltage, and thereby the chopping current is detected. Then, a motor is caused to rotate at a constant speed by feeding the detection results back to the control circuit and subjecting the driving signal of the bridge circuit to PWM control. The techniques disclosed in JP-A-2003-189683 and JP-A-2008-042975 are known as examples of this kind of conventional technique for a motor driver.

With a circuit device such as this kind of motor driver, there is a problem in that a current is switched on and off repeatedly using a switching operation in the bridge circuit, and therefore the substrate potential varies. There is a risk that variation in the substrate potential will negatively influence the operation of other circuits included on the substrate.

For example, with the motor driver, the substrate potential varies since a large current is needed to drive a motor and the current is switched on and off repeatedly using a chopping operation. Accordingly, a detection circuit formed on the substrate is negatively influenced by the variation in the substrate potential, and therefore a problem occurs in that the chopping current detection results vary, and the accuracy of the rotation speed of the motor, which is being controlled so as to be constant, and the like decrease.

According to some aspects of the invention, it is possible to provide a circuit device, an electronic apparatus, and the like, according to which it is possible to suppress a negative influence on circuit operation caused by variation in a substrate potential.

SUMMARY

One aspect of the invention relates to a circuit device including: a bridge circuit having a high-side transistor and a low-side transistor; a detection circuit configured to detect a current flowing in the bridge circuit; a control circuit configured to, based on the detection result from the detection circuit, control switching on and off of the high-side transistor and the low-side transistor; and a guard region that is provided between the high-side transistor and low-side transistor and the detection circuit and is for setting a substrate of the circuit device to a substrate potential.

In one aspect of the invention, current flowing in the bridge circuit is detected by the detection circuit, and based on the detection result, switching on and off of the high-side transistor and the low-side transistor in the bridge circuit is controlled by the control circuit. Also, a guard region for setting the substrate to a substrate potential is provided between the high-side and low-side transistors and the detection circuit. Accordingly, in the region of the high-side transistor and the low-side transistor, if noise is generated, that is, the substrate potential varies due to the transistors being controlled so as to switch on and off, it is possible to suppress a case in which the noise is transmitted to the region of the detection circuit and the circuit operation of the detection circuit is negatively influenced. Accordingly, it is possible to provide a circuit device and the like, according to which it is possible to suppress a negative influence on a circuit operation caused by variation in a substrate potential.

Also, in one aspect of the invention, the guard region may have a first conductivity type buried layer that is formed in the first conductivity type substrate, a first conductivity type well that is formed on the first conductivity type buried layer, and a first conductivity type impurity layer that is formed in the first conductivity type well.

With this configuration, the substrate can be set to the substrate potential by the first conductivity type well and the first conductivity type buried layer formed in the depth direction from the substrate surface. Accordingly, stability in the substrate potential at a location that is deep below the substrate surface can be realized, and a noise absorption/blocking function of the guard region can be improved.

Also, in one aspect of the invention, the first conductivity type well may be a layer obtained by introducing a first conductivity type impurity into an epitaxial layer.

With this configuration, the first conductivity type well can be formed by growing the epitaxial layer on the first conductivity type buried layer and introducing the first conductivity type impurity into the epitaxial layer, for example. Also, the substrate potential can be supplied to the first conductivity type buried layer via the first conductivity type impurity layer and the first conductivity type well.

Also, in one aspect of the invention, the high-side transistor and the low-side transistor may be transistors having a DMOS structure.

By thus using transistors having a DMOS structure as the high-side transistor and the low-side transistor, the breakdown voltage of the transistors can be raised, and it is possible to drive a driving target at a high voltage using the bridge circuit. If the driving voltage is thus raised, there is a risk that the amplitude of noise generated by the on/off switching operation at the high voltage of the high-side and low-side transistors will increase. However, the noise with such a large amplitude can also be effectively suppressed by providing the guard region.

Also, in one aspect of the present invention, the transistor having the DMOS structure may be formed above a second conductivity type buried layer that is formed in the first conductivity type substrate.

By thus forming the second conductivity type buried layer in the first conductivity type substrate and forming a transistor having a DMOS structure thereon, a high breakdown voltage transistor having a DMOS structure can be realized.

Also, in one aspect of the invention, the guard region may have a first conductivity type buried layer.

With this configuration, the first conductivity type buried layer corresponding to the second conductivity type buried layer of the transistor having the DMOS structure can be formed in the guard region. Accordingly, for example, the depth distance of the guard region from the substrate surface can be made approximately equal to the depth distance of the DMOS structure, and the noise absorption/blocking function of the guard region can be improved.

Also, in one aspect of the present invention, the transistor having the DMOS structure may be formed in a second conductivity type deep well that is formed by an epitaxial layer on the second conductivity type buried layer.

With this configuration, the epitaxial layer is formed on the second conductivity type buried layer and a second conductivity type impurity is introduced into the epitaxial layer, whereby it is possible to realize a second conductivity type deep well for forming the transistor having the DMOS structure.

Also, in one aspect of the invention, the guard region may have a first conductivity type buried layer, a first conductivity type well formed by the epitaxial layer on the first conductivity type buried layer, and an first conductivity type impurity layer formed in the first conductivity type well.

With this configuration, the first conductivity type buried layer and the first conductivity type well can be formed in the guard region in correspondence with the second conductivity type buried layer and the second conductivity type deep well of the transistor having the DMOS structure. Accordingly, a guard region with a large depth distance from the substrate surface can be formed using an efficient manufacturing process.

Also, in one aspect of the invention, a second guard region may be included which is provided between the high-side transistor and the low-side transistor and is for setting the substrate to the substrate potential.

With this configuration, if noise is generated in the low-side transistor for example, the noise can be efficiently absorbed or blocked by the second guard region formed at a location nearer to the low-side transistor compared to the guard region.

Also, in one aspect of the invention, the low-side transistor and the high-side transistor of the bridge circuit may be transistors having a DMOS structure that are formed above a first n-type buried layer in a n-type substrate, and the detection circuit may be constituted by a transistor having a CMOS structure that is formed above a second n-type buried layer separate from the first n-type buried layer.

With this configuration, the detection circuit constituted by the transistor having the CMOS structure is formed above the second n-type buried layer separated from the first n-type buried layer, and the detection circuit is isolated from the p-type substrate by the second n-type buried layer. Accordingly, it is possible to suppress, with further reliability, a case in which noise that is generated by the low-side transistor and the high-side transistor is transmitted to the detection circuit and the circuit operation is negatively influenced.

Also, another aspect of the present invention relates to an electronic apparatus including a circuit device according to any part of the foregoing description.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes preferred embodiments of the invention in detail. It should be noted that the embodiment to be described hereinafter is not intended to unduly limit the scope of the invention defined by the appended claims and that the entire configuration to be described in the embodiment is not necessarily essential as the means for achieving the invention.

1. Circuit Configuration of Circuit Device

Figure 1:
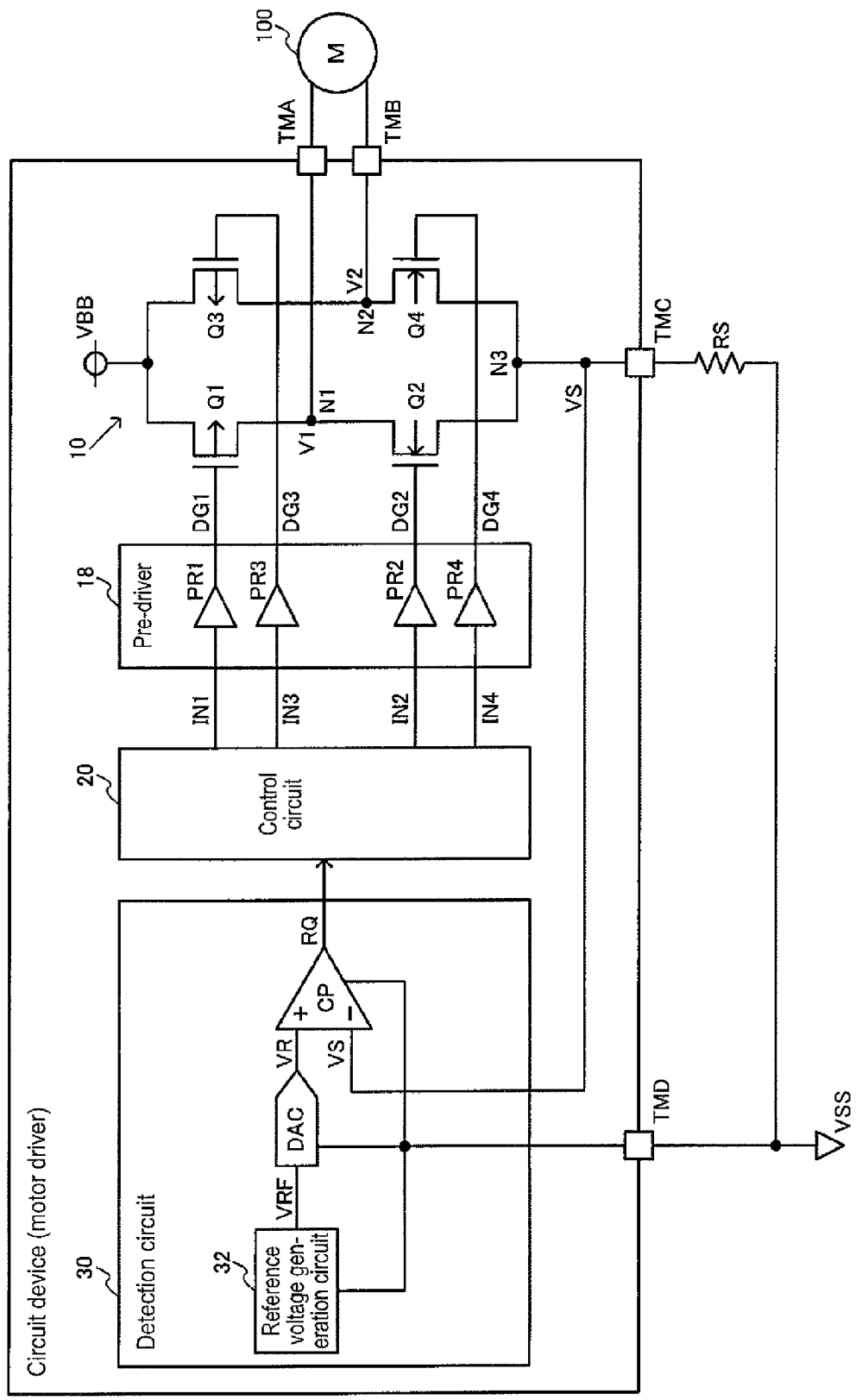
FIG. 1 shows an example of a circuit configuration of a circuit device according to an embodiment.

FIG. 1 shows an example of a circuit configuration of a circuit device according to the present embodiment. The circuit device according to the present embodiment includes a bridge circuit 10, a control circuit 20, and a detection circuit 30. It can also include a pre-driver 18. Note that the circuit device according to the present embodiment is not limited to the configuration shown in FIG. 1 and is capable of being implemented with various modifications, such as removal of a portion of the constituent elements or addition of other constituent elements.

The bridge circuit 10 has high-side transistors Q1 and Q3 and low-side transistors Q2 and Q4. The bridge circuit 10 is a circuit that outputs a driving current to a motor 100 (e.g., a DC motor), and in FIG. 1, the bridge circuit 10 has an H bridge circuit configuration. The high-side transistors Q1 and Q3 are p-type (broadly interpreted as "first conductivity type") transistors, for example, and the low-side transistors Q2 and Q4 are n-type (broadly interpreted as "second conductivity type") transistors, for example. The high-side transistors are the transistors that are connected closer to the high-potential power supply than the low-side transistors are. The low-side transistors are the transistors connected closer to the low-potential power supply than the high-side transistors are. Note that all of the transistors Q1, Q2, Q3, and Q4 may be n-type transistors. Also, body diodes (parasitic diodes) (not shown) exist between the sources and drains of Q1, Q2, Q3, and Q4.

The sources of the high-side transistors Q1 and Q3 are connected to the node of a power supply VBB (first power supply) on the high potential side. The sources of the low-side transistors Q2 and Q4 are connected to a node N3, to which one end of a sense resistor RS is connected. The node N3 is connected to one end of the sense resistor RS, which is an external part, via a terminal TMC of the circuit device.

The drain of the transistor Q1 and the drain of the transistor Q2 are connected to a node N1 that is connected to one end of an external motor 100 (broadly interpreted as "driving target"). The node N1 is connected to one end of the motor 100 via a terminal TMA of the circuit device.

The drain of the transistor Q3 and the drain of the transistor Q4 are connected to a node N2 that is connected to the other end of the motor 100. The node N2 is connected to the other end of the motor 100 via a terminal TMB of the circuit device.

The detection circuit 30 detects current flowing in the bridge circuit 10. Also, the detection circuit 31 detects the charge current in the charge period by detecting the voltage VS of one end of the sense resistor RS. For example, the charge current is detected by detecting the difference in voltage between a voltage VS and the voltage of a low-potential side power supply VSS (e.g., GND) (difference in voltage between the voltage of one end and the voltage of the other end of the sense resistor RS). Note that a configuration may be used in which a first detection circuit configured to detect the difference in voltage between the voltage VS and the voltage of VSS, and a second detection circuit configured to detect the voltage VS are provided as the detection circuit 30.

The detection circuit 30 includes a reference voltage generation circuit 32, a D/A conversion circuit DAC, and a comparison circuit CP (comparator). The reference voltage generation circuit 32 generates a reference voltage VRF with a constant voltage. The D/A conversion circuit DAC receives the reference voltage VRF and generates a reference voltage VR that varies based on setting data. The comparison circuit CP receives input of the reference voltage VR in a first input terminal (non-inverting input terminal), receives input of the voltage VS, which is the voltage of one end of the sense resistor RS, in a second input terminal (inverting input terminal), and outputs a detection result signal RQ. For example, as will be described later, the chopping current is determined using the reference voltage VR input to the comparison circuit CP, and it is therefore possible to control the torque of the motor 100 by changing the reference voltage VR using that D/A conversion circuit DAC.

Based on the detection result in the detection circuit 30, the control circuit 20 controls the switching on and off of the high-side transistors Q1 and Q3 and the low-side transistors Q2 and Q4. Specifically, based on the detection result signal RQ from the detection circuit 30, control signals IN1, IN2, IN3, and IN4, which are PWM signals, are generated. These control signals IN1, IN2, IN3, and IN4 control the length of the charge period.

The pre-driver 18 buffers the control signals IN1, IN2, IN3, and IN4 from the control circuit 20 and outputs driving signals DG1, DG2, DG3, and DG4 to the gates of the transistors Q1, Q2, Q3, and Q4. The pre-driver 18 has driver circuits PR1, PR2, PR3, and PR4 that buffer the control signals IN1, IN2, IN3, and IN4 and output the driving signals DG1, DG2, DG3, and DG4.

Note that the circuit device shown in FIG. 1 is constituted by an IC chip, for example, and terminals TMA, TMB, TMC, and TMD correspond to terminals of the IC chip package or pads on the semiconductor substrate. Also, in this case, the circuit device, which is an IC chip, is mounted on a circuit board (printed circuit board, etc.), and the sense resistor RS, which is an external circuit part, is also mounted on the circuit board. Also, the sense resistor RS and the terminals TMC and TMD are electrically connected by wiring on the circuit board.

Next, operations of the bridge circuit 10 of the circuit apparatus according to the present embodiment will be described with reference to FIGS. 2(A) and 2(B).

Figure 2A:
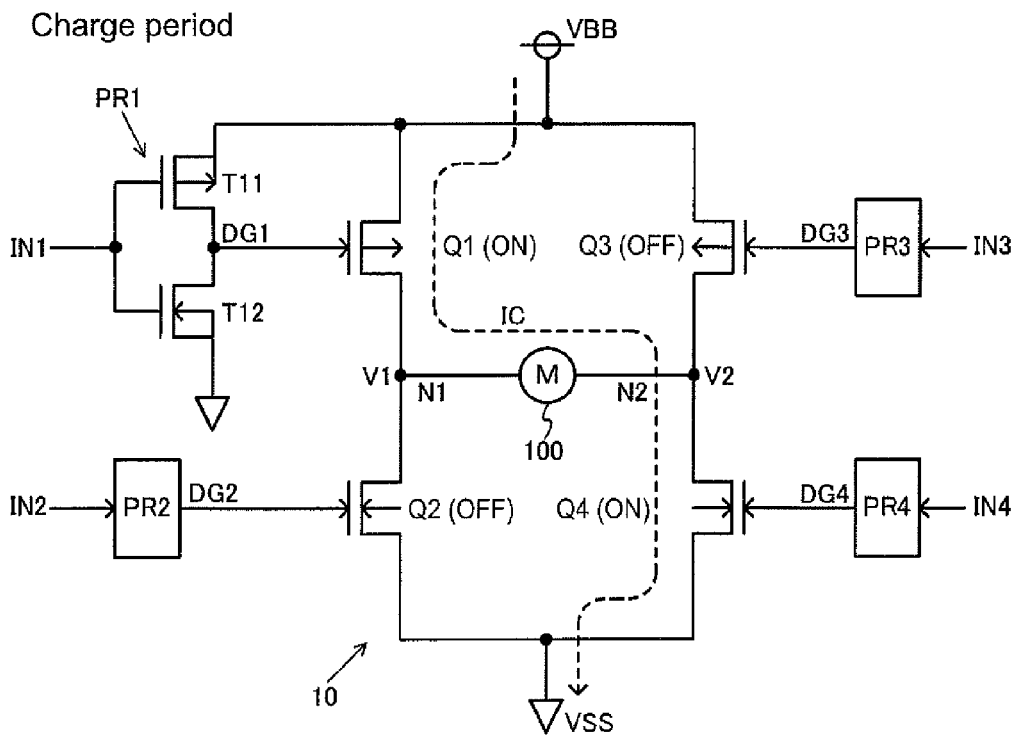
FIGS. 2(A) and 2(B) are diagrams for describing operations of a bridge circuit.

As shown in FIG. 2(A), the transistors Q1 and Q4 are on in the charge period. Accordingly, a charge current IC flows from the high-potential side power supply VBB to the low-potential side power supply VSS (GND) via the transistor Q1, the motor 100 (motor coil), and the transistor Q4.

Figure 2B:
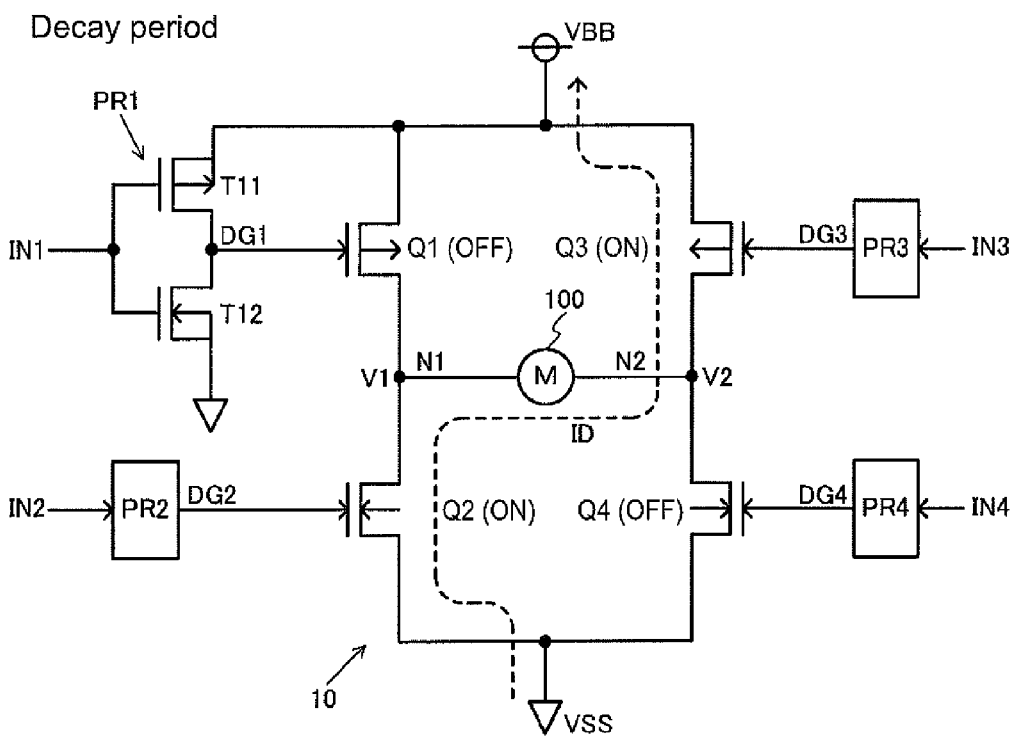

On the other hand, in the decay period, as shown in FIG. 2(B), the transistors Q2 and Q3 are on, and a decay current ID flows from the power supply VSS to the power supply VBB via the transistor Q2, the motor 100, and the transistor Q3. Both the charge current IC and the decay current ID flow from the positive terminal to the negative terminal of the motor 100.

Figure 3:
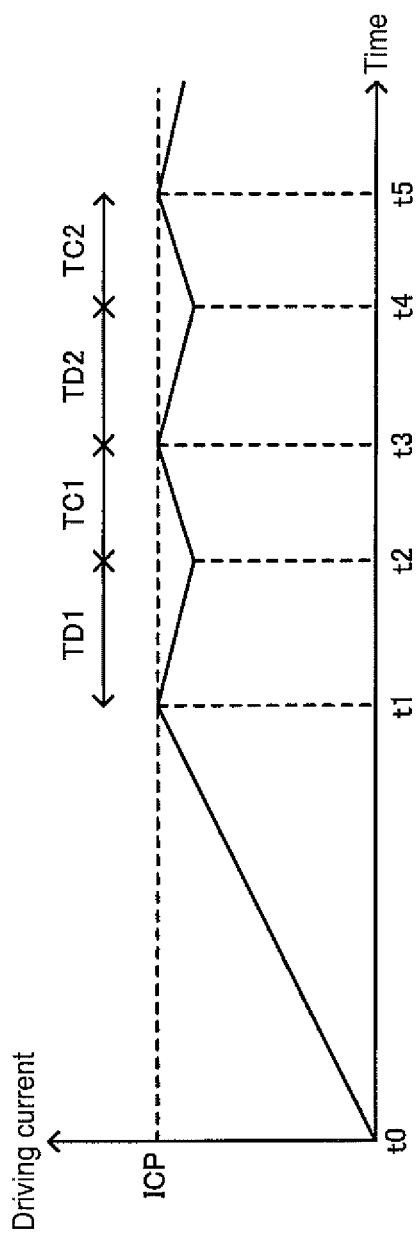
FIG. 3 is a diagram for describing a method for controlling a chopping operation in which a sense resistor is used.

Also, as shown in FIG. 1, the sense resistor RS is provided between the node N3, to which the sources of the transistors Q2 and Q4 are connected, and the node of the power supply VSS. The comparison circuit CP compares the voltage VS of the node N3 and the reference voltage VR. Also, as shown in FIG. 3, the control circuit 20 performs control of a chopping operation for keeping the chopping current ICP that flows in the bridge circuit 10 constant. Specifically, the control circuit 20 controls the pulse width of the PWM signals (IN1 to IN4) so that the chopping current ICP is constant, and the switching on and off of the transistors Q1 to Q4 is controlled based on the PWM signals.

For example, when the driving of the motor 100 is started at time t0 in FIG. 3, the charge period shown in FIG. 2(A) is started, the transistors Q1 and Q4 are switched on, and the transistors Q2 and Q3 are switched off. Accordingly, the driving current (charge current IC) flows from the power supply VBB to the power supply VSS via the transistor Q1, the motor 100, and the transistor Q4. Then, at timing t1, when the driving current of the motor 100 reaches the chopping current ICP, switching to the decay period TD1 is performed. Specifically, if the driving current increases and the voltage VS of the node N3 exceeds the reference voltage VR, the comparison result signal RQ of the comparison circuit CP will switch from low level to high level, and switching to the decay period TD1 will be performed at time t1. The driving current of the motor 100 at time t1 is the chopping current ICP, and the chopping current ICP is detected with the detection of the voltage VS.

Upon switching to the decay period TD1, as shown in FIG. 2(B), the transistors Q2 and Q3 switch on, and the transistors Q1 and Q4 switch off. Accordingly, the driving current (decay current ID) flows from the power supply VSS to the power supply VBB via the transistor Q2, the motor 100, and the transistor Q3. In the decay period TD1, as shown in FIG. 3, the driving current of the motor 100 decreases as time elapses.

Then, using a timer (counter circuit) or the like for example, the control circuit 20 detects that a predetermined amount of time has elapsed since the start of the decay period TD1, and switching from the decay period TD1 to the charge period TC1 is performed. In the charge period TC1, when the driving current of the motor 100 increases and reaches the chopping current ICP, switching to the decay period TD2 is performed once again. Thereafter, by repeating this process, control is performed according to which the chopping current ICP, which is the peak current of the driving current, becomes constant, and the rotation speed of the motor 100 is kept constant.

Note that a case in which the bridge circuit 10 is an H bridge type was described above, but the present embodiment is not limited thereto, and the bridge circuit 10 may be a half-bridge type. In this case, the transistors Q3 and Q4 are not provided as the bridge circuit 10, and the transistors Q1 and Q2 are provided. Also a description was given above taking, as an example, a case in which the circuit device is a motor driver that drives the motor 100, but the object being driven by the circuit device of the present embodiment is not limited to being the motor 100, and various elements and devices having an inductor (coil) can be used as the object being driven. Also, in FIG. 1, an example was described in which switching on and off of the transistors Q1 to Q4 in the bridge circuit 10 is controlled by detecting the voltage VS of one end of the sense resistor RS, but the present embodiment is not limited thereto. For example, it is possible to control switching on and off of the transistors Q1 to Q4 by detecting the current flowing in the bridge circuit 10 without using the sense resistor RS.

2. Arrangement Configuration of Circuit Device

With the circuit device shown in FIG. 1, when the bridge circuit 10 drives the motor 100 using the chopping current, a large current flows in the drains of the transistors Q1 to Q4 that constitute the bridge circuit 10. The large current is switched on and off by the chopping operation, and the direction in which it flows is reversed. Therefore, the drain voltages of the transistors Q1 to Q4 in the bridge circuit 10 undergo significant variation in potential. When this kind of potential variation occurs, the potential variation is noise, analog circuits such as the detection circuit 30 are negatively influenced, and a malfunction occurs in the detection operation of the detection circuit 30, for example.

For example, in the decay period shown in FIG. 2(B), the decay current ID flows from the low-potential side power supply VSS to the high-potential side power supply VBB via the transistor Q2, the motor 100, and the transistor Q3. Accordingly, a negative voltage, which has a negative potential with respect to the power supply VSS (GND), is applied to the drain (node N1) of the low-side transistor Q2. For this reason, the parasitic diode formed in the region of the n-type transistor Q2 enters a forward-biased state, and noise is generated, that is, the potential of the substrate varies significantly. This is problematic in that the noise hinders correct circuit operation by negatively influencing analog circuits in the circuit device. For example, the detection circuit 30, which is an analog circuit, performs a circuit operation of comparing the voltage VS of the sense resistor RS and the reference voltage VR as described above. However, the noise causes a malfunction to occur in the circuit operation, leading to erroneous detection of the chopping current, or the like.

Figure 4:
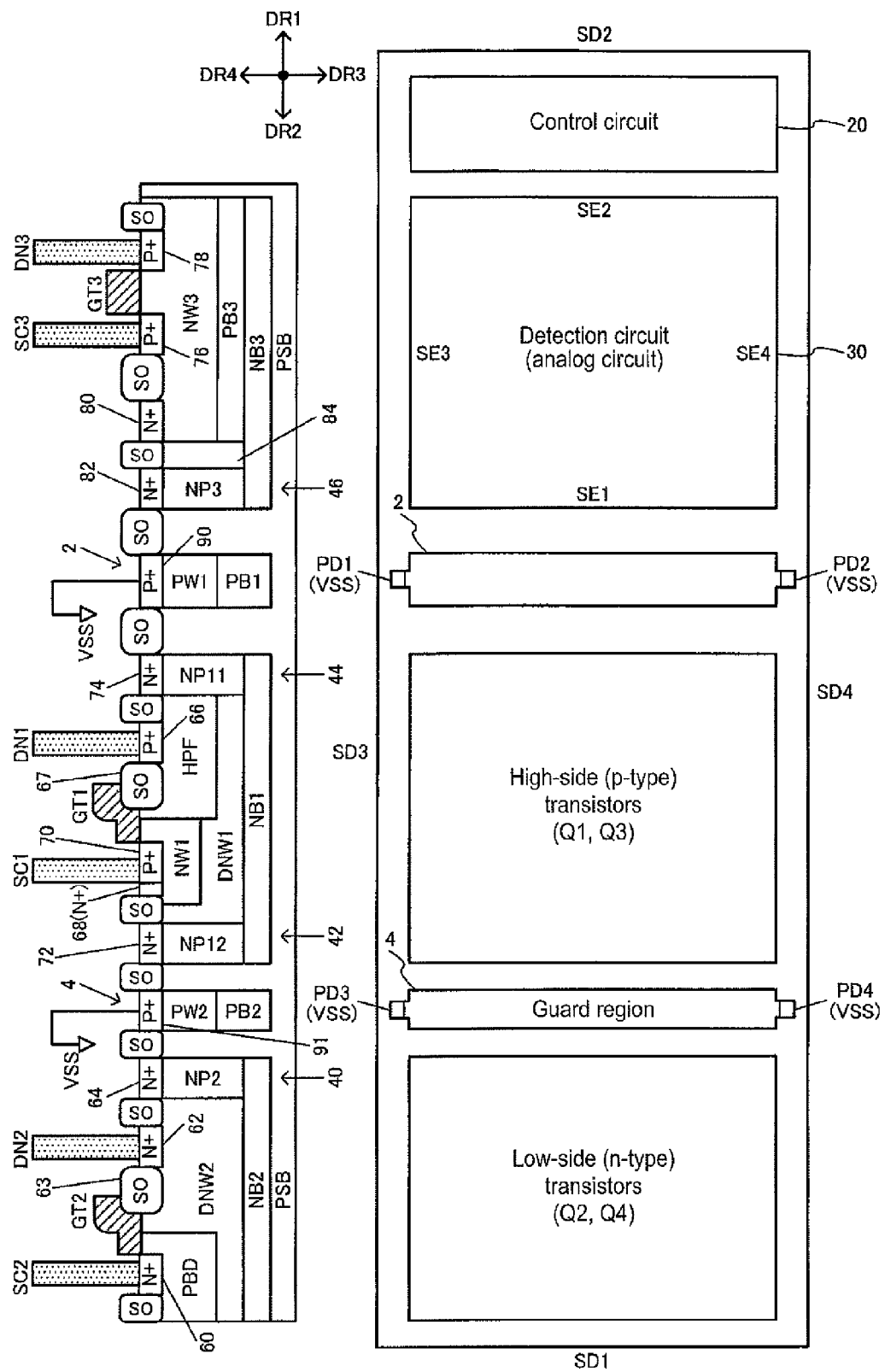
FIG. 4 shows an example of an arrangement configuration and a device structure of a circuit device according to an embodiment.

FIG. 4 shows an example of an arrangement configuration of the circuit device of the present embodiment, by which the foregoing problem can be solved. The right side of FIG. 4 is a plan view of a semiconductor chip of the circuit device in a view from above, and the left side of FIG. 4 is a cross-sectional view schematically showing a cross section of the semiconductor chip of the circuit device.

As described above, the circuit device of the present embodiment has a bridge circuit 10 that includes the high-side transistors Q1 and Q3 and the low-side transistors Q2 and Q4, a detection circuit 30 that detects current flowing in the bridge circuit 10, and a control circuit 20 that controls switching on and off of the transistors Q1 to Q4 based on the detection result of the detection circuit 30.

Also, as shown in the plan view on the right side of FIG. 4 (circuit arrangement layout diagram), the circuit device of the present embodiment has a guard region 2 that is provided between the high-side transistors Q1 and Q3 and the low-side transistors Q2 and Q4 and the detection circuit 30 and is for setting the substrate PSB of the circuit device to the substrate potential (e.g., VSS=GND).

For example, the first side of the semiconductor chip of the circuit device is SD1, the second side opposing the side SD1 is SD2, the side perpendicular to (intersecting) the sides SD1 and SD2 is SD3, and the side opposing the side SD3 is a fourth side SD4. Also, a direction from the side SD1 to the side SD2 is a first direction DR1, the direction opposite to the direction DR1 is a second direction DR2, the direction perpendicular to the directions DR1 and DR2 is a third direction DR3, and the direction opposite to the direction DR3 is a fourth direction DR4. In this case, the guard region 2 is provided on the direction DR1 side of the high-side transistors Q1 and Q3 and the low-side transistors Q2 and Q4, and the detection circuit 30 (widely interpreted as "analog circuit") is provided on the direction DR1 side of the guard region 2. Also, the control circuit 20 is provided on the direction DR1 side of the detection circuit 30. Also, the low-side transistors Q2 and Q4 are provided on the direction DR2 side of the high-side transistors Q1 and Q3. Also, the guard region 2 is formed along the direction DR3, for example, in the region between the high-side transistors Q1 and Q3 and the detection circuit 30. That is to say, the guard region 2 is formed such that the direction of its longer side is the direction DR3.

Also, in FIG. 4, the circuit device has a guard region 4 (second guard region) that is provided between the high-side transistors Q1 and Q3 and the low-side transistors Q2 and Q4 and is for setting the substrate PSB to the substrate potential. That is to say, the guard region 4 is provided on the direction DR2 side of the high-side transistors Q1 and Q3, and the low-side transistors Q2 and Q4 are provided on the direction DR2 side of the guard region 4. Note that a modification is also possible in which only the guard region 2 is provided and the guard region 4 is not provided.

The guard regions 2 and 4 have noise absorption and noise blocking functions, and are called "guard rings". The guard region 2 can be constituted by a metal interconnect (aluminum interconnect, etc.) that is electrically connected to the pads PD1 and PD2, and impurity layers that are formed in the substrate PSB and are electrically connected to the metal interconnect via a contact or the like. The guard region 4 can be constituted by a metal interconnect (aluminum interconnect, etc.) that is electrically connected to the pads PD3 and PD4, and impurity layers that are formed in the substrate PSB and are electrically connected to the metal interconnect via a contact or the like.

If the substrate PSB is p-type (first conductivity type), the impurity layers are also p-type. The impurity layers are impurity diffusion layers, for example. The pads PD1, PD2, PD3, and PD4 correspond to the terminal TMD in FIG. 1, and a power supply VSS (GND) is supplied to the pads PD1 to PD4. The pads PD1 to PD4 are electrodes formed on the semiconductor substrate, and may be pads for wire bonding, or bump pads (Bumps on Pads). The pads PD1 to PD4 are formed in an I/O region of the circuit device, for example. The I/O region is a region for performing input and output of signals and voltages with an external device, and it is a region at which the pads and an electrostatic protection element (I/O cell) are provided, for example.

Note that in FIG. 4, the guard regions 2 and 4 have rectangular shapes that extend along the direction DR3 in plan view, but the shapes of the guard regions 2 and 4 are not limited thereto. For example, they may have shapes that are bent to the direction DR1 side or the direction DR2 side.

With the circuit device having the bridge circuit 10 as described above, noise is generated due to the drain voltages of the transistors Q1 to Q4 in the bridge circuit 10 significantly varying in potential due to the chopping operation and the like, and the noise caused by the variation in potential negatively influences the detection circuit 30 and the like. For example, in the decay period, a negative voltage is applied to the drain of the low-side transistor Q2, whereby the parasitic diode constituted by the p-type substrate and the n-type buried layer (NB2) and deep n-type well (DNW2) of the transistor Q2 enters a forward-biased state, and thus noise is generated, that is, the potential of the substrate varies significantly. The noise negatively influences the detection circuit 30 and the like, causing erroneous detection of the chopping current and the like.

In view of this, in FIG. 4, the guard region 2 is provided between the high-side transistors Q1 and Q3 and low-side transistors Q2 and Q4 and the detection circuit 30. Also, the guard region 4 is provided between the high-side transistors Q1 and Q3 and the low-side transistors Q2 and Q4. Accordingly, even if the above-described noise caused by the chopping operation of the bridge circuit 10 is generated, the noise can be absorbed and blocked by the guard regions 2 and 4, and it is possible to suppress the occurrence of a malfunction in the circuit operation of the circuit device.

3. Device Structure

Next, a device structure of a transistor in the circuit device according to the present embodiment will be described in detail with reference to the cross-sectional view on the left side of FIG. 4. In the present embodiment, as shown in the cross-sectional view of FIG. 4, transistors having a DMOS (Double-diffused Metal Oxide Semiconductor) structure are used as the transistors Q1 to Q4 included in the bridge circuit 10. On the other hand, transistors having a CMOS (Complementary Metal Oxide Semiconductor) structure are used as the transistors included in the detection circuit 30, the logic circuit 20, and the like.

First, the device structure of the low-side n-type transistors Q2 and Q4 (hereinafter referred to as "n-type DMOS" as needed) will be described.

Note that a case in which the first conductivity type is the p-type will be described below, but the first conductivity type may be the n-type. For example, in FIG. 4, the substrate PSB is a p-type substrate, but an n-type substrate may be used as the substrate PSB. Also, among the directions orthogonal to the plane of the substrate PSB of the circuit device (thickness direction), a position in the direction of the side on which circuits are formed on the substrate PSB (side on which layers are stacked using a semiconductor process) will be referred to as "above", and a position in the direction opposite thereto will be referred to as "under".

An n-type (second conductivity type) buried layer NB2 (N+ Buried Layer) is formed in the p-type (first conductivity type) substrate PSB, which is a silicon substrate. A deep n-type well DNW2 of the n-type DMOS is formed on the n-type buried layer NB2. A p-type body PBD (p-type impurity layer) is formed in the source SC2 side of the deep n-type well DNW2. Then, an n-type impurity layer 60 corresponding to the source SC2 of the n-type DMOS is formed in the p-type body PBD. Also, an n-type impurity layer 62 corresponding to the drain DN2 of the n-type DMOS is formed on the drain DN2 side of the deep n-type well DNW2. The impurity layers 60 and 62 are n-type impurity diffusion layers, for example.

An insulating layer 63 (e.g., SiO$_2$) is formed in the deep n-type well DNW2, in contact with the n-type impurity layer 62 corresponding to the drain DN2. The insulating layer 63 is formed by so-called LOCOS (Local Oxidation of Silicon). Then, a gate layer GT2 (e.g., polysilicon layer) is formed above the p-type body PBD, the deep n-type well DNW2, and the insulating layer 63. Note that in FIG. 4 and subsequent figures, the insulating layers are written as "SO".

An n-type plug NP2 (n-type impurity layer) for supplying a potential to the n-type buried layer NB2 is provided in a border region 40 on the direction DR1 side (guard region 4 side) of the n-type DMOS. Specifically, the n-type plug NP2 is formed on the n-type buried layer NB2, and an n-type impurity layer 64 is formed on the n-type plug NP2. Note that a p-type impurity layer (not shown) can be formed on both sides of the n-type plug NP2. Also, a voltage that is the same as the voltage of the drain DN2, for example, is supplied to the n-type impurity layer 64, and the voltage given to the n-type impurity layer 64 is supplied to the n-type buried layer NB2 via the n-type plug NP2.

Note that it is desirable that the n-type plug is provided also in the border region on the direction DR2 side of the n-type DMOS. Also, a buried layer is an impurity layer formed under an impurity layer on the substrate surface layer (e.g., a deep n-type well or a p-type body). Specifically, as shown in later-described FIGS. 10(A) to 10(E), a buried layer is formed under an epitaxial layer by introducing an n-type impurity or a p-type impurity into the silicon substrate and growing an epitaxial layer (single-crystal silicon layer) on it.

The device structure of the high-side p-type transistors Q1 and Q3 (hereinafter referred to as "p-type DMOS" as needed) will be described next.

An n-type buried layer NB1 is formed in the p-type substrate PSB, and a deep n-type well DNW1 is formed on the n-type buried layer NB1. A p-type impurity layer HPF (HPOF) is formed in the deep n-type well DNW1, and a p-type impurity layer 66 (diffusion layer) corresponding to the drain DN1 of the p-type DMOS is formed in the p-type impurity layer HPF. An n-type well NW1 (low breakdown voltage n-type well) is formed in the deep n-type well DNW1. An n-type impurity layer 68 and a p-type impurity layer 70 corresponding to the source SC1 of the p-type DMOS are formed in the n-type well NW1. An insulating layer 67 is formed in contact with the p-type impurity layer 66 corresponding to the drain DN1, and a gate layer GT1 (e.g., a polysilicon layer) is formed above the n-type well NW1, the p-type impurity layer HPF, and the insulating layer 67.

An n-type plug NP12 (n-type impurity layer) for supplying a voltage to the n-type buried layer NB1 is provided in a border region 42 on the direction DR2 side (guard region 4 side) of the p-type DMOS. Specifically, the n-type plug NP12 is formed on the n-type buried layer NB1, and an n-type impurity layer 72 is formed on the n-type plug NP12. Note that a p-type impurity layer (not shown) can be formed on the direction DR1 side of the n-type plug NP12. Also, for example, the voltage of the high-potential side power supply (VBB) is supplied to the n-type impurity layer 72, and the voltage of the high-potential side power supply is supplied to the n-type buried layer NB1 via the n-type plug NP12.

An n-type plug NP11 (n-type impurity layer) for supplying a voltage to the n-type buried layer NB1 is provided in a border region 44 on the direction DR1 side (guard region 2 side) of the p-type DMOS. Specifically, the n-type plug NP11 is formed on the n-type buried layer NB1, and an n-type impurity layer 71 is formed on the n-type plug NP14. Note that a p-type impurity layer (not shown) can be formed on the direction DR1 side of the n-type plug NP21. Also, for example, the voltage of the high-potential side power supply (VBB) is supplied to the n-type impurity layer 74, and the voltage of the high-potential side power supply is supplied to the n-type buried layer NB1 via the n-type plug NP11.

Next, a device structure of a p-type transistor having a CMOS structure (hereinafter referred to as "PMOS" as needed) will be described. The PMOS is a transistor included in the detection circuit 30. The detection circuit 30 is constituted by the PMOS and an n-type transistor having a CMOS structure (hereinafter referred to as "NMOS" as needed), which is not shown in FIG. 4.

An n-type buried layer NB3 for separating a PMOS or NMOS, which is a transistors having a CMOS structure, from the substrate PSB is formed in the region of the detection circuit 30. Specifically, the n-type buried layer NB3 is formed in the p-type substrate PSB, and a p-type buried layer PB3 is formed on the n-type buried layer NB3. Also, a PMOS or an NMOS, which is a transistor having a CMOS structure, is formed above the p-type buried layer PB3.

For example, an n-type well NW3 (e.g., an intermediate breakdown voltage n-type well) of the PMOS is formed on the p-type buried layer PB3, and a p-type impurity layer 76 corresponding to the source SC3 of the PMOS is formed in the n-type well NW3. Also, a p-type impurity layer 78 corresponding to the drain DN4 of the PMOS is formed in the N-type well NW3. A gate layer GT3 is formed above the n-type well NW3, between the p-type impurity layer 76 and the p-type impurity layer 78. An n-type impurity layer 80 for supplying a voltage to the n-type well NW3 is furthermore formed in the n-type well NW3. For example, the voltage of the high-potential side power supply is supplied to the n-type impurity layer 80.

An n-type plug NP3 for supplying a potential to the n-type buried layer NB3 is provided in a border region 46 on the direction DR2 side (guard region 2 side) of the PMOS. Specifically, the n-type plug NP3 is formed on the n-type buried layer NB3, and an n-type impurity layer 82 is formed on the N-type plug NP3. Note that a p-type impurity layer 84 is formed on the direction DR1 side of the n-type plug NP3. Also, a p-type impurity layer (not shown) can be formed on the direction DR2 side of the n-type plug NP3 as well. Also, the voltage of the high-potential side power supply given to the n-type impurity layer 82 is supplied to the n-type buried layer NB3 via the n-type plug NP3.

Note that in the case of forming the NMOS having the CMOS structure included in the detection circuit 30, a p-type well (e.g., an intermediate breakdown voltage p-type well) is formed on the p-type buried layer PB3. Also, an n-type impurity layer that is to be the drain of the NMOS, an n-type impurity layer that is to be the source of the NMOS, and a p-type impurity layer for supplying the voltage of the low-potential side power supply (VSS) to the p-type well are formed in the p-type well, and thereby an NMOS having a CMOS structure can be formed.

4. Guard Region

Next, the guard region 2 will be described in detail with reference to FIG. 5. Note that the guard region 4 has a structure similar to that of the guard region 2, and therefore a detailed description thereof will not be included here.

Figure 5:
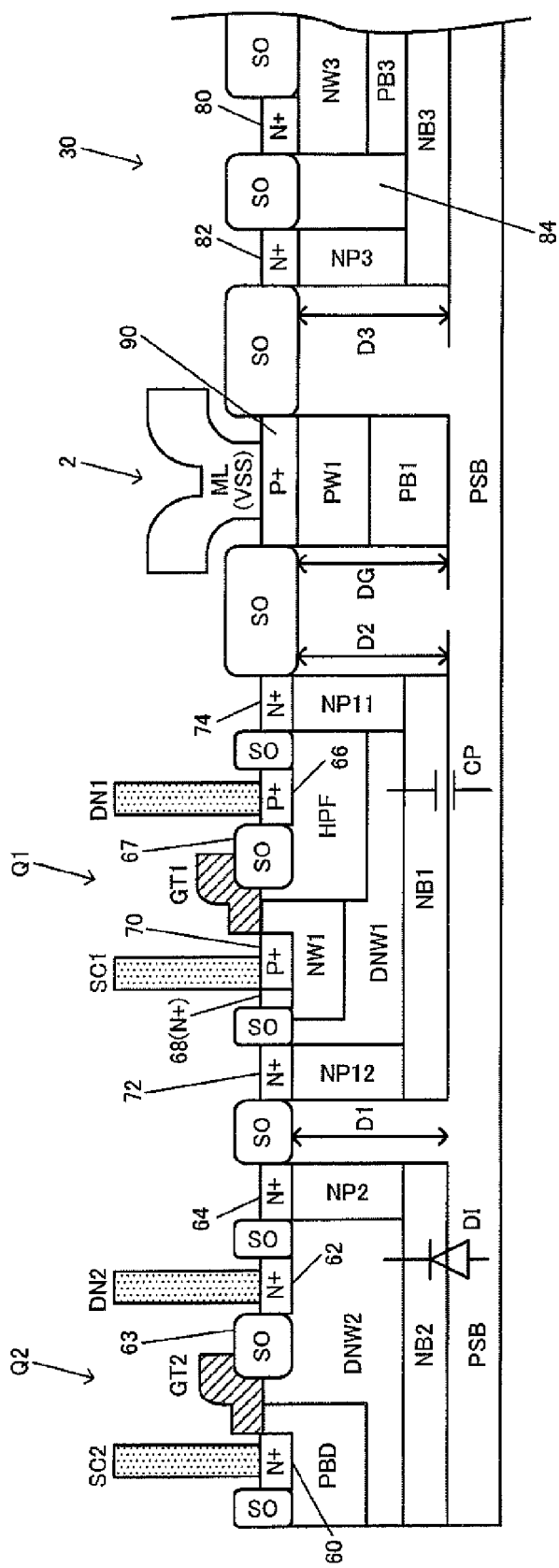
FIG. 5 is a diagram for describing a guard region in detail.

As shown in FIG. 5, the guard region 2 has a p-type (first conductivity type. The same follows below) buried layer PB1 (P+ Buried Layer), a p-type well PW1 (low breakdown voltage p-type well), and a p-type impurity layer 90 (p-type diffusion layer). The p-type buried layer PB1 is formed in the p-type substrate PSB. The p-type well PW1 is formed on the p-type buried layer PB1. The p-type impurity layer 90 is formed on the p-type well PW1. The p-type impurity layer 90 is electrically connected to a metal layer ML (aluminum layer) via a contact. The metal layer ML forms a metal interconnect supplying the low-potential side power supply VSS, and is electrically connected to the pads PD1 and PD2 shown in FIG. 4. For example, the pads PD1 and PD2 are electrically connected by the metal interconnect formed by the metal layer ML. With this configuration, the voltage of VSS (ground voltage) given to the p-type impurity layer 90 via the pads PD1 and PD2 and the metal layer ML is supplied to the substrate PSB via the p-type buried layer PB1 and the p-type well PW1, and stabilization of the potential of the substrate PSB is achieved.

Note that similarly to the guard region 2, the guard region 4 has a p-type buried layer PB2, a p-type well PW2, and a p-type impurity layer 91, as shown in FIG. 4. Also, the pads PD3 and PD4 in FIG. 4 are electrically connected by a metal interconnect formed by a metal layer ML in the guard region 4.

Also, as will be described later using FIGS. 12(B) and 12(C), the p-type well PW1 (PW2) is a layer obtained by introducing a p-type impurity into an epitaxial layer. With this configuration, after the p-type buried layer PB1 is formed, an epitaxial layer is grown, and a p-type impurity is introduced into the epitaxial layer, and it is thereby possible to form the p-type well PW1. Also, by forming this kind of p-type well PW1, the voltage of the power supply VSS given to the p-type impurity layer 90 can be transmitted to the p-type buried layer PB1 via the p-type well PW1.

Also, as described above, the high-side transistor Q1 (Q3) and the low-side transistor Q2 (Q4) are transistors having a DMOS structure. If this kind of transistor having a DMOS structure is used, a sufficient breakdown voltage in the transistor can be ensured, and the motor 100 can be driven appropriately, even in the case where the high-voltage power supply VBB (e.g., 40 to 50 V) is used as the power supply of the motor driver.

Also, as shown in FIG. 5, the transistors Q1 and Q2 having the DMOS structure are formed above the n-type buried layers NB1 and NB2 that are formed in the p-type substrate PSB. For example, the high-side transistor Q1 is formed above the n-type buried layer NB1 formed on the substrate PSB, and the low-side transistor Q2 is formed on the n-type buried layer NB2 formed above the substrate PSB. The n-type buried layer NB1 of the transistor Q1 and the re-type buried layer NB2 of the transistor Q2 are separated via the p-type substrate PSB. By doing so, the transistors Q1 and Q2 having the DMOS structure can be separated from the p-type substrate PSB by the n-type buried layers NB1 and NB2, and the transistors Q1 and Q2 can be formed above the n-type buried layers NB1 and NB2.

Also, in the present embodiment, in view of the fact that the transistors Q1 and Q2 with the DMOS structure are formed above the n-type buried layers NB1 and NB2 in this way, the p-type buried layer PB1 is provided in the guard region 4 as well. That is to say, as is evident from later-described FIGS. 10(C) and 10(D), after (or before) the n-type buried layers NB1 and NB2 are formed in the p-type substrate PSB, it is easy to form the p-type buried layer PB1 (PB2). Accordingly, it is possible to form the guard region 4 such that it extends to the p-type buried layer PB1, which is located deep below the surface (face on the circuit-forming side) of the p-type substrate PSB. By forming the guard region 4 at such a deep location, it is possible to further improve the noise absorption/blocking function of the guard region 2, as will be described in detail later.

Also, the transistors Q1 and Q2 with the DMOS structure are formed in the deep n-type wells DNW1 and DNW2 (second conductivity type deep wells) formed in epitaxial layers, above the n-type buried layers NB1 and NB2. For example, as shown in later-described FIGS. 10(E) and 11(A), by forming epitaxial layers (PEP') on the n-type buried layers NB1 and NB2 and introducing an n-type impurity into the epitaxial layers, the deep n-type wells DNW1 and DNW2 are formed. Also, the high-side transistor Q1 is formed in the deep n-type well DNW1 and the low-side transistor Q2 is formed in the deep n-type well DNW2. By doing so, it is possible to form the transistors Q1 and Q2 having the DMOS structure.

Also, in this case, the guard region 2 has the p-type buried layer PB1, the p-type well PW1 formed by an epitaxial layer on the buried layer PB1, and the p-type impurity layer 90 formed on the p-type well PW1.

Figure 10A:
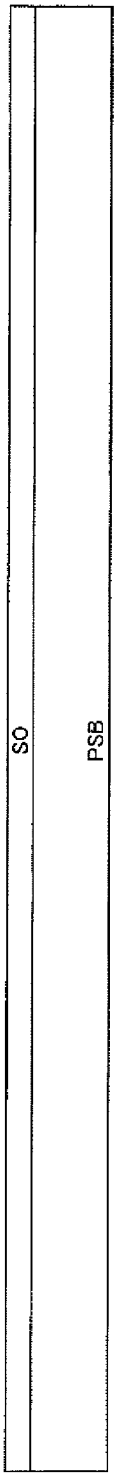
FIGS. 10A to 10E show a manufacturing process flow for a guard region and transistors having a DMOS structure.
Figure 10B:
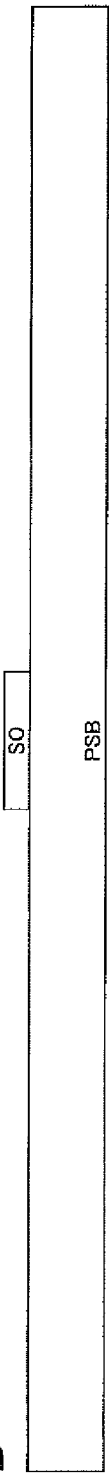
Figure 10C:
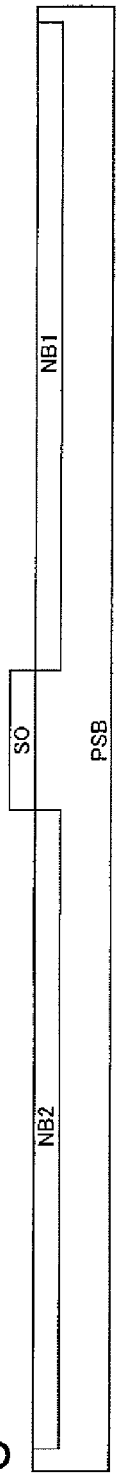
Figure 10D:
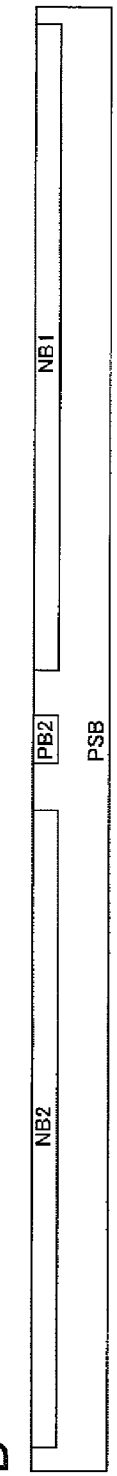
Figure 10E:
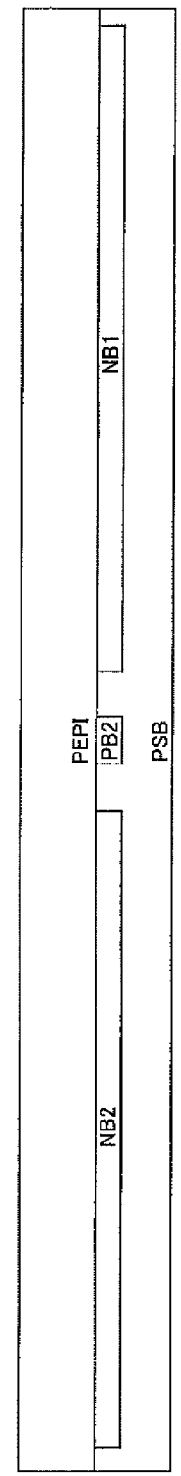
Figure 11A:
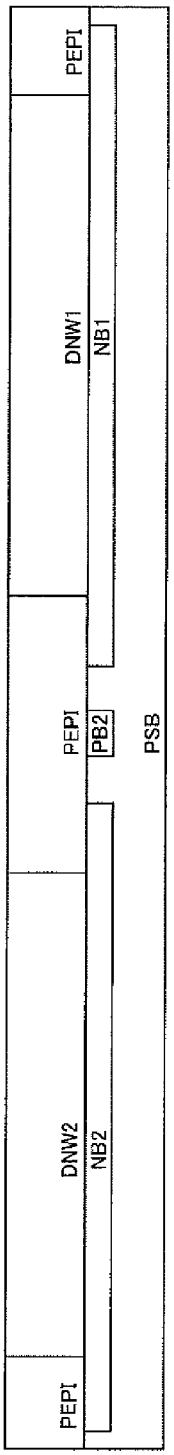
FIGS. 11A to 11D show a manufacturing process flow for a guard region and transistors having a DMOS structure.

That is to say, as shown in FIGS. 10(E) and 11(A), in the regions of the transistors Q1 and Q2, by growing an epitaxial layer on the n-type buried layers NB1 and NB2 and introducing an n-type impurity into the epitaxial layer, the deep n-type wells DNW1 and DNW2 are formed. Similarly, in the guard region 2 (guard region 4) as well, the p-type well PW1 (PW2) is formed by growing an epitaxial layer on the p-type buried layer PB1 (PB2) and introducing a p-type impurity into the epitaxial layer.

By doing so, it is possible to use the epitaxial layer formed on the buried layers NB1, NB2, and PB1 to form the p-type well PW1 in the guard region 2 and form the deep n-type wells DNW1 and DNW2 in the regions of the transistors Q1 and Q2. Accordingly, the guard region 2 composed of the p-type buried layer PB1, the p-type well PW1, and the p-type impurity layer 90 can be formed by effectively using part of the manufacturing process for the transistors Q1 and Q2, and an efficient manufacturing process for the circuit device can be realized.

A noise absorption/blocking function of the guard region 2 will be described next in detail. As shown in FIG. 5, a parasitic diode DI is formed between the n-type buried layer NB2 and the deep n-type well DNW2 of the low-side transistor Q2 and the p-type substrate PSB. The parasitic diode DI is a diode in which the direction from the p-type substrate PSB to the n-type buried layer NB2 is the forward direction.

On the other hand, in the bridge circuit 10 of the circuit device according to the present invention, the decay current ID flows from the low-potential side power supply VSS to the high-potential side power supply VBB via the transistor Q2, the motor 100, and the transistor Q3. Accordingly, a negative voltage is applied to the n-type impurity layer 62, which is to be the drain of the low-side transistor Q2, and the negative voltage is applied to the n-type buried layer NB2 and the deep n-type well DNW2 as well. As a result, the parasitic diode enters a forward-biased state, and noise is generated, that is, the potential of the p-type substrate PSB set to the VSS varies significantly.

Also, a parasitic capacitance CP exists between the p-type substrate PSB and the n-type buried layer NB1 in the region of the high-side transistor Q1 as well. When the bridge circuit 10 drives the motor using a chopping current, a large current flows in the drain DN1 (p-type impurity layer 66) of the transistor Q1. The large current is switched on and off by the chopping operation and the direction in which it flows is reversed, and therefore the voltage of the drain DN1 varies significantly. Also, the voltage variation of the drain DN1 is transferred to the p-type substrate PSB via the parasitic capacitance CP, and noise is generated, that is, the substrate potential varies significantly.

When noise such as that described above is generated, analog circuits such as the detection circuit 30 are negatively influenced and an erroneous operation or the like of the circuit will occur. For example, with the circuit device shown in FIG. 1, the chopping current flowing in the bridge circuit 10 is kept constant by the detection circuit 30 comparing the voltage VS of one end of the sense resistor RS with the reference voltage VR. At this time, if the comparison circuit CP, the reference voltage generation circuit 32, and the D/A conversion circuit DAC of the detection circuit 30 are influenced by noise transmitted to the detection circuit 30 via the p-type substrate PSB, there is a risk that a malfunction will occur in the detection operation of the detection circuit 30. For example, if the comparison accuracy of the comparison circuit CP decreases or the reference voltage VR varies, erroneous detection of the chopping current or the like will occur.

In view of this, in the present embodiment, since a guard region 2 having a noise absorption/blocking function is provided between the transistors Q1 to Q4 of the bridge circuit 10 and the detection circuit 30, it is possible to effectively suppress a case in which the above-described noise is transmitted to the detection circuit 30. That is to say, the power supply VSS is supplied to the p-type well PW1 and the p-type buried layer PB1 of the guard region 2 via the pads PD1 and PD2, the metal layer ML, and the p-type impurity layer 90. Accordingly, the noise from the transistors Q1 to Q4 of the bridge circuit 10 can be absorbed by the p-type well PW1 and the p-type buried layer PB1. Also, as shown in FIG. 5, the p-type well and the p-type buried layer PB1 are formed so as to extend from the surface of the p-type substrate PSB to a distance DG in the depth direction. Accordingly, the p-type well PW1 and the p-type buried layer PB1 are barriers by which the noise can be blocked.

In FIG. 5 in particular, the p-type buried layer PB1 of the guard region 2 is formed in correspondence with the n-type buried layers NB1 and NB2 of the transistors Q1 and Q2 in the bridge circuit 10. Also, by introducing an impurity into a epitaxial layer on the p-type buried layer PB1, the p-type well PW1 is formed in the guard region 2 in correspondence with the deep n-type wells DNW1 and DNW2, which were formed by introducing an impurity into an epitaxial layer on the n-type buried layers NB1 and NB2. Accordingly, the depth distance DG from the substrate surface of the guard region 2 can be set to a distance that is approximately equal to the depth distances D1 and D2 of the transistors Q1 and Q2. Accordingly, noise from the transistors Q1 and Q2 with the DMOS structure can be effectively absorbed or blocked by the guard region 2 formed so as to extend in the depth direction to the depth distance DG.

That is to say, with a standard guard region, which is called a guard ring, only the p-type impurity diffusion layer (reference numeral 90 in FIG. 6) is formed. This kind of guard region is problematic in that the depth distance from the substrate surface cannot be made long and noise from the transistors Q1 and Q2 with the DMOS structure cannot be effectively absorbed or blocked.

In view of this, in the present embodiment, part of the manufacturing process for the transistors Q1 and Q2 with the DMOS structure is used to form the p-type buried layer PB1 and the p-type well PW1 of the guard region 2. Accordingly, since the depth distance DG of the guard region 2 can be made approximately equal to the depth distances D1 and D2 of the transistors Q1 and Q2, noise from the transistors Q1 and Q2 can effectively be absorbed and blocked. Also, in the case where a structure is used in which the CMOS transistor of the detection circuit 30 is formed above the n-type buried layer NB3, the depth distance DG of the guard region 2 can be made approximately equal to the depth distance D3 of the CMOS transistor. Accordingly, it is possible to effectively suppress a case in which noise enters the CMOS transistor of the detection circuit 30.

Also, in the present embodiment, as shown in FIG. 4, the guard region 4 for setting the p-type substrate PS to the substrate potential (VSS) is provided between the high-side transistors Q1 and Q3 and the low-side transistors Q2 and Q4. If the guard region 4 is provided, it is possible to effectively absorb noise generated due to the parasitic diode DI in the region of the transistors Q2 and Q4 entering a forward-biased state due to the negative voltage in the decay period. That is to say, compared to the guard region 2, the guard region 4 is formed at a location nearer to the low-side transistors Q2 and Q4. Accordingly, compared to the parasitic resistance of the path between the guard region 2 and the parasitic diode DI, the impedance of the parasitic resistance of the path between the guard region 4 and the parasitic diode DI is lower. Accordingly, by providing the guard region 4, noise generated by the parasitic diode DI entering the forward-biased state can be suppressed with a high absorption effect.

Also, in the present embodiment, as shown in FIG. 5, the transistors Q1 and Q2 in the bridge circuit 10 are transistors having a DMOS structure that are formed above the n-type buried layers NB1 and NB2 (first n-type buried layers) in the p-type substrate PSB. On the other hand, the detection circuit 30 includes a transistor having a CMOS structure that is formed above the n-type buried layer NB3 (second n-type buried layer) and is isolated from the n-type buried layers NB1 and NB2.

Specifically, as shown in FIGS. 4 and 5, the n-type buried layer NB3 for separation from the p-type substrate PSB is formed in the region of the transistor having the CMOS structure included in the detection circuit 30. Specifically, an n-type buried layer NB3 is formed in the p-type substrate PSB, and a p-type buried layer PB3 is formed on the n-type buried layer NB3. Also, the CMOS transistor included in the detection circuit 30 is formed above the p-type buried layer PB3. In FIGS. 4 and 5, an example of a PMOS transistor is shown as a transistor with a CMOS structure.

With this configuration, the n-type buried layer NB3 that is isolated from the n-type buried layers NB1 and NB2 of the transistors Q1 and Q2 in the bridge circuit 10 can be used to separate the detection circuit 30 constituted by the transistor with the CMOS structure from the p-type substrate PSB. Accordingly, transmission of noise from the transistors Q1 and Q2 can be suppressed with further reliability. That is to say, transmission of noise from the transistors Q1 and Q2 can be suppressed by the guard region 2, and the transmission of noise can be suppressed with further reliability by forming the n-type buried layer NB3 in the region of the detection circuit 30.

For example, in the present embodiment, it is desirable that the circuit region of the detection circuit 30 is surrounded by the region of the n-type plug NP3 (hereinafter referred to as "n-type plug region") that sets the potential of the n-type buried layer NB3. With this configuration, a bathtub-shaped n-type region can be formed by the n-type buried layer NB3 and the n-type plug region surrounding the n-type buried layer NB3, and the region of the detection circuit 30 can be isolated from the p-type substrate PSB by the n-type region. Also, since the potential (high-potential side power supply) is set from the n-type plug NP3 even if fluctuation in the potential of the p-type substrate PSB is transferred to the n-type buried layer NB3, the detection circuit 30 can be reliably isolated. Also, since the n-type buried layer NB3 is set to a potential that is higher than that of the p-type substrate PSB, it can be isolated by a reverse-biased p-n junction.

Here, a circuit region is a region in which a circuit is arranged in plan view on the substrate. For example, if a circuit is constituted by one or more circuit blocks in a circuit layout, the circuit region is the region in which the circuit block has been arranged. For example, the region in which the circuit blocks constituting the detection circuit 30 (comparison circuit CP, D/A conversion circuit DAC, and reference voltage generation circuit 32) are arranged is the circuit region of the detection circuit 30.

Also, if the n-type plug region is provided so as to surround the entire periphery of the circuit region of the detection circuit 30, there is a risk that the layout area of the detection circuit 30 will be too large, incurring an increase in the size of the circuit device. For this reason, if priority is given to reducing the layout area, among sides SE1 to SE4 of the detection circuit 30 in FIG. 4, the n-type plug region is formed in the region of the side SE1, which opposes the guard region 2 for example, whereas the n-type plug region is not formed in the regions of sides SE2, SE3, and SE4 in some cases. Note that the side SE2 is the side opposing the side SE1, and the sides SE3 and SE4 are sides that are perpendicular to (intersect) the sides SE1 and SE2.

Thus, if the n-type plug region is not formed in the regions of the sides SE2, SE3, and SE4, there is a risk that noise from the transistors Q1 to Q4 in the bridge circuit 10 will be transmitted to the interior portion of the circuit region of the detection circuit 30 via the sides SE2, SE3, and SE4.

In view of this, in the present embodiment, the guard region 2 is provided between the transistors Q1 to Q4 in the bridge circuit 10 and the detection circuit 30. Accordingly, using the noise absorption/blocking function of the guard region 2, it is possible to effectively suppress a case in which noise is transmitted to the interior portion of the circuit region of the detection circuit 30 via the regions of the sides SE2, SE3, and S4. Accordingly, it is possible to realize both a reduction in size of the layout area and suppression of noise.

Figure 6:
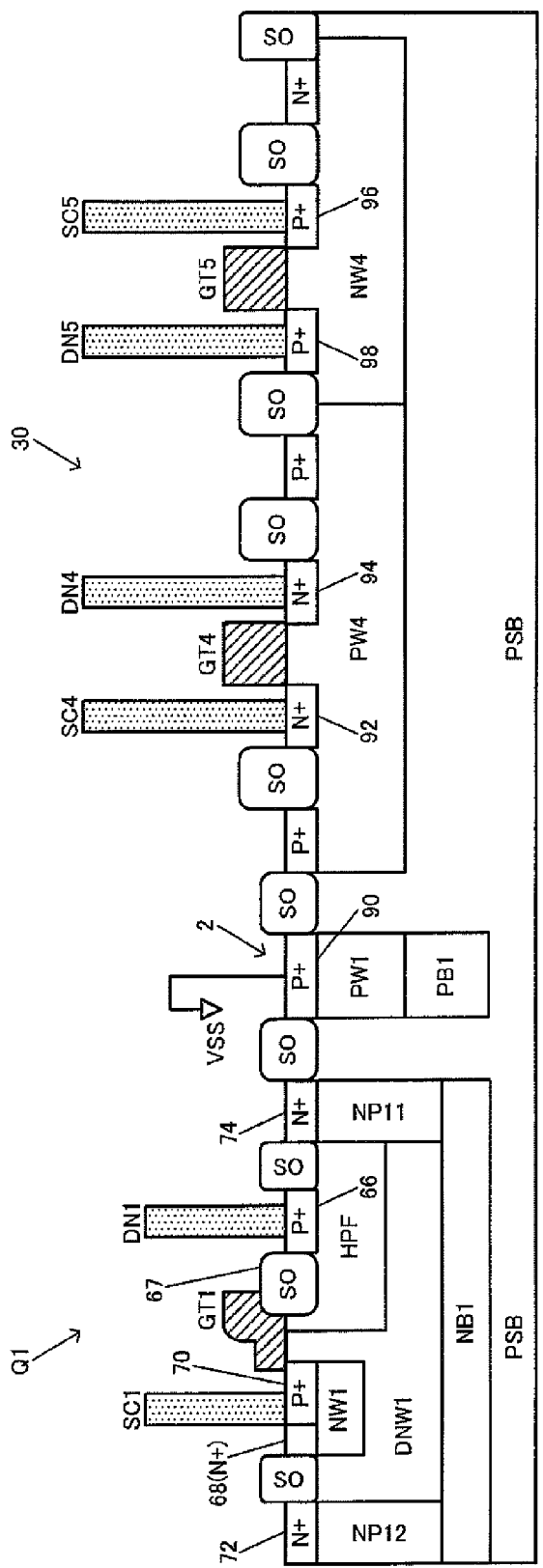
FIG. 6 shows another example of a device configuration of a CMOS transistor included in a detection circuit.

Also, in the present embodiment, as shown in FIG. 6, a CMOS transistor having a normal structure in which an n-type buried layer is not formed may be used as a transistor that is part of the detection circuit 30. With the CMOS transistor having the normal structure shown in FIG. 6, a p-type well PW4 and an n-type well NW4 are formed in the p-type substrate PSB. Also, an NMOS constituted by n-type impurity layers 92 and 94 that are to be a source SC4 and drain DN4, and a gate GT4 is formed in the p-type well PW4. Also, a PMOS constituted by n-type impurity layers 96 and 98 that are to be a source SC5 and drain DN5, and a gate GT5 is formed in the n-type well NW4.

By using this kind of CMOS transistor having a normal structure, the layout area of the detection circuit 30 can be made smaller compared to the CMOS transistor having the structure in which the n-type buried layer is provided, as in FIG. 4.

However, if the CMOS transistor having the normal structure is used, there is a risk that noise from the transistors Q1 to Q4 of the bridge circuit 10 will be transmitted as-is to the NMOS and the PMOS of the detection circuit 30 via the p-type substrate PSB, causing a malfunction in the circuit operation of the detection circuit 30.

In view of this, in the present embodiment, the guard region 2 is provided between the transistors Q1 to Q4 and the detection circuit 30. Accordingly, even in the case where this kind of CMOS transistor having a normal structure is used, it is possible to effectively suppress a case in which noise from the transistors Q1 to Q4 is transmitted to the NMOS and PMOS having the normal structure that are included in the detection circuit 30. Accordingly, it is possible to realize both a reduction in size of the layout area and suppression of noise.

Figure 7:
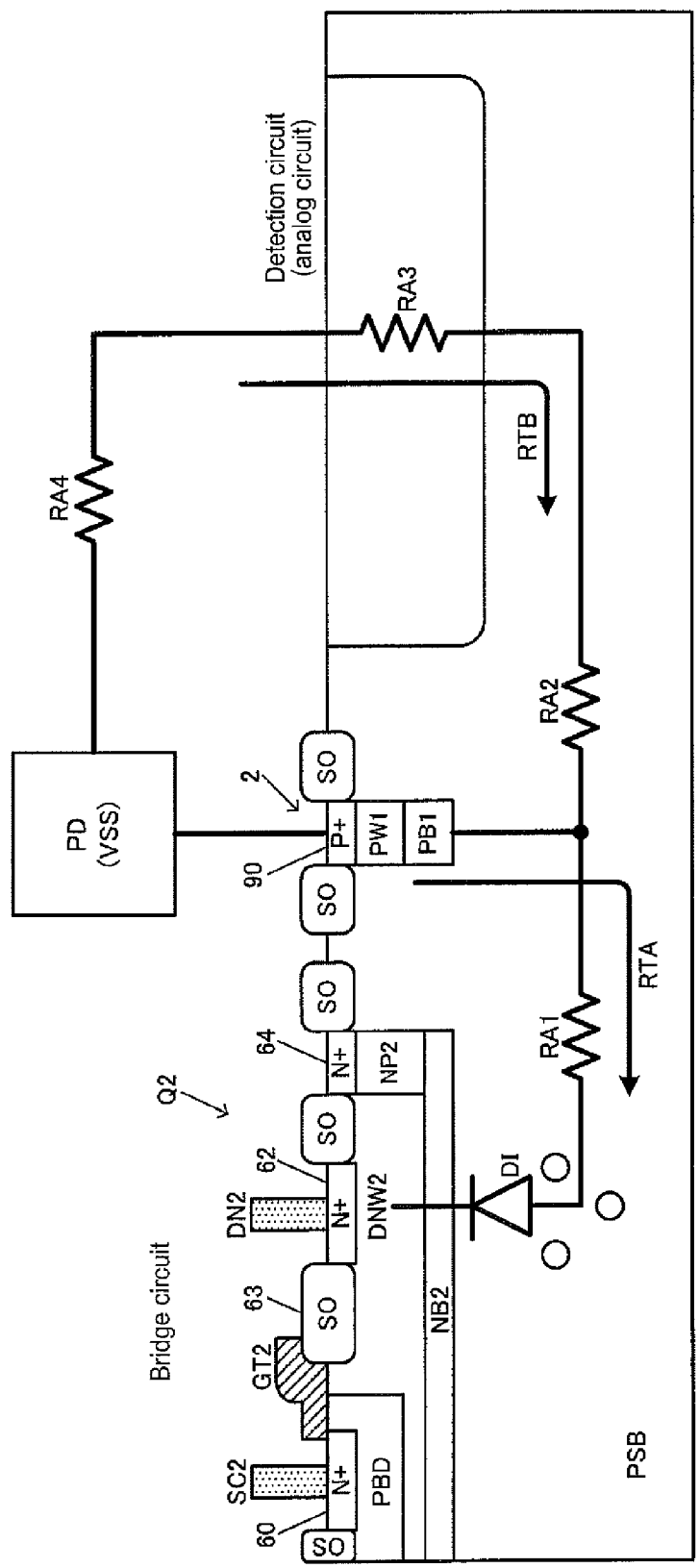
FIG. 7 is a diagram for describing a principle of noise suppression by means of the guard region.

FIG. 7 is a diagram for schematically describing the principle of noise suppression performed by the guard region 2. As shown in FIG. 7, the parasitic diode DI is formed between the p-type substrate PSB and the n-type buried layer NB2. The cathode of the parasitic diode DI is constituted by the deep n-type well DNW2 and the n-type impurity layer 62 (drain DN2 of Q2). Due to a negative voltage being applied to the n-type impurity layer 62 in the decay period, the parasitic diode DI enters a forward-biased state, the potential of the p-type substrate PSB on the near side of (below) the transistor Q2 is swung toward the negative side, becoming noise.

The noise represented by white circles in FIG. 7 is absorbed in the pad PD of the VSS, and routes RTA and RTB are used as the routes in this case. Note that reference numerals RA1 to RA4 represent parasitic resistances of the p-type substrate PSB and the interconnect. In FIG. 7, the noise (white circles) is absorbed through the route RTA, which has a lower impedance than the route RTB, and therefore most of the noise does not reach the detection circuit 30, which is an analog circuit. The noise generated in this way by the transistor Q2 is absorbed by the guard region 2, and the noise is thus prevented from being transmitted to the detection circuit 30, and thus the detection circuit 30 operates reliably without being influenced by the noise.

Figure 8:
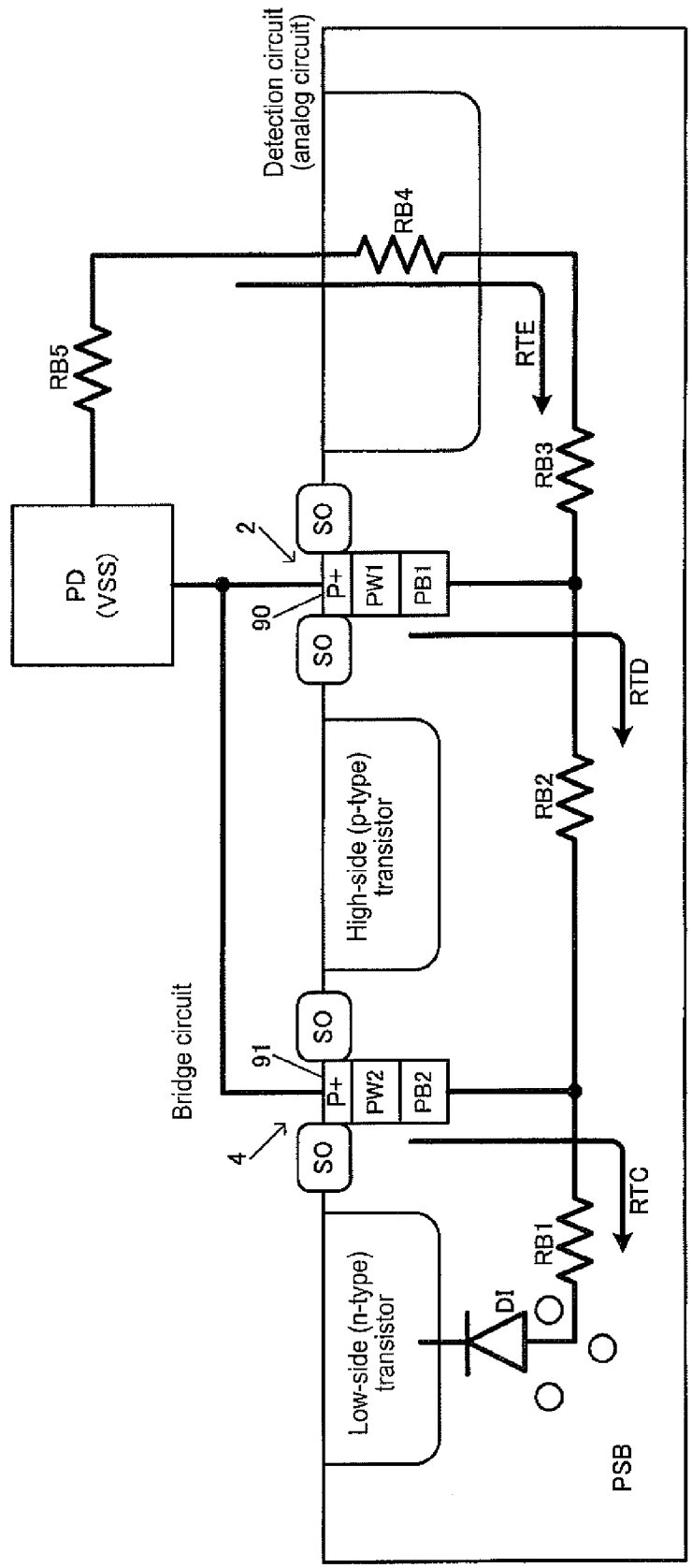
FIG. 8 is a diagram for describing a principle of noise suppression by means of a guard region.

FIG. 8 is a diagram for schematically describing the principle of noise suppression in the case where the guard region 4 is further provided in addition to the guard region 2.

The noise represented by white circles in FIG. 8 is absorbed in the pad PD of the VSS, and routes RTC, RTD, and RTE are used as the routes in this case. Note that reference numerals RB1 to RB5 represent parasitic resistances of the p-type substrate PSB and the interconnect. In FIG. 8, the noise (white circles) is absorbed through the routes RTC and RTD, which have lower impedances than the route RTE, and therefore most of the noise does not reach the detection circuit 30. In particular, by providing the guard region 4, the route RTC with a low impedance can be formed at a location near the source at which the noise (white circles) is generated. Accordingly, the noise generated by the parasitic diode DI of the low-side transistors Q2 and Q4 can be effectively absorbed, and transmission of noise can be effectively suppressed.

Figure 9:
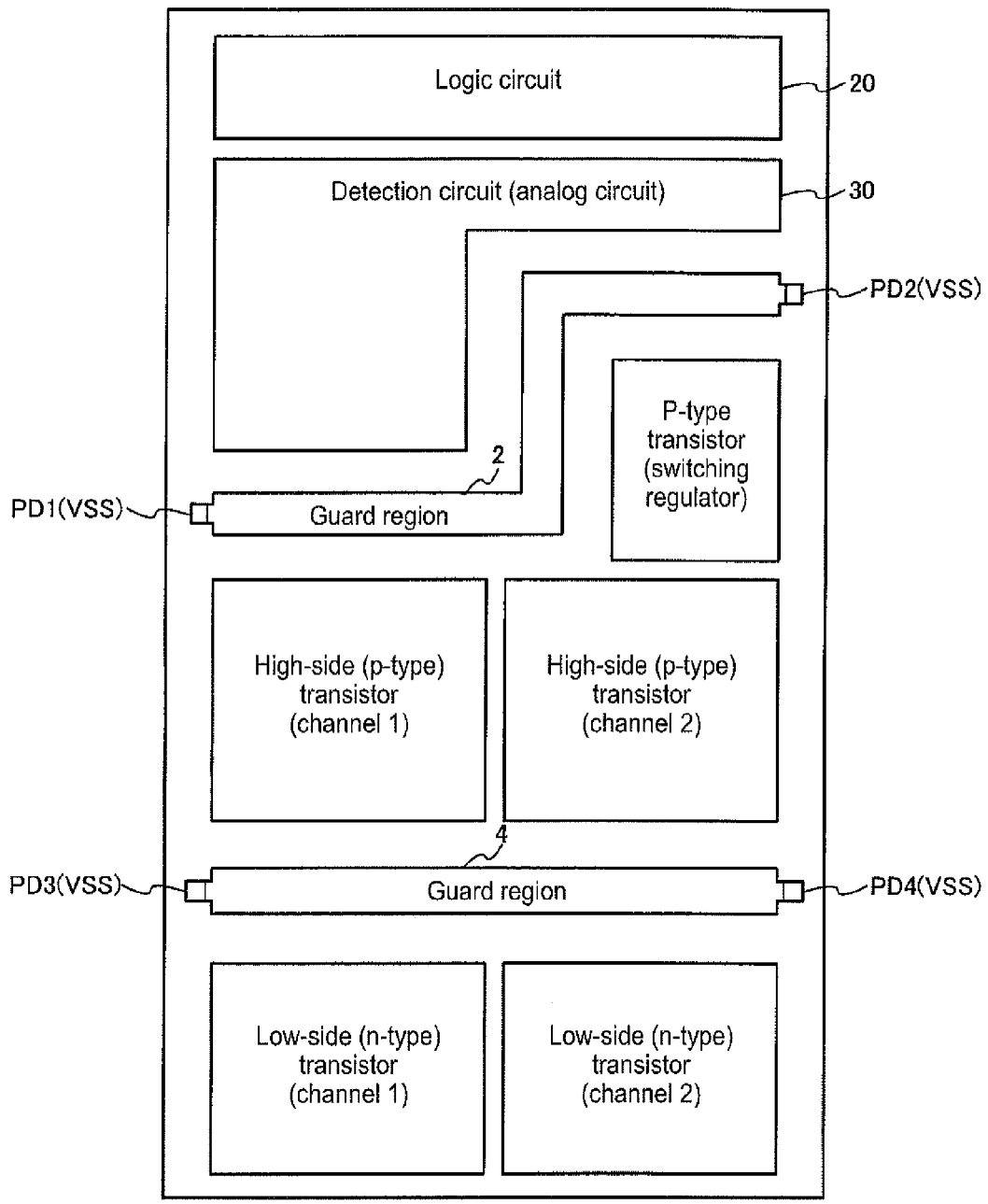
FIG. 9 shows another example of an arrangement configuration of a circuit device according to an embodiment.

FIG. 9 shows another example of an arrangement configuration of the circuit device according to the present embodiment. In FIG. 9, transistors of two channels, namely channels 1 and 2, are provided as the high-side and low-side transistors. Also, a p-type transistor formed with a high breakdown voltage process is formed similarly to these transistors. The p-type transistor is used as a switching transistor for a switching regulator that steps down the voltage of the high-potential side power supply (e.g., 40 to 50 V) used in the bridge circuit 10, for example, so as to generate a voltage of an intermediate-potential power supply (e.g., 5V).

Also, in FIG. 9, the guard region 2 is provided between the high-side and low-side transistors of channels 1 and 2 and p-type transistor (switching regulator) and the detection circuit 30. In FIG. 4, the guard region 2 had a linear shape, but in FIG. 9, it has a shape that is bent in the middle. Also, the guard region 4 is provided between the high-side transistors of channels 1 and 2 and the low-side transistors of channels 1 and 2. Thus, various modifications of the arrangement configuration (layout arrangement) of the circuit device according to the present embodiment are possible.

5. Manufacturing Process

A manufacturing process flow for a transistor having a DMOS structure and a guard region will be described next with reference to FIGS. 10(A) to 13(C). Note that the left side of each figure indicates a low-side n-type transistor (Q2, Q4), and the right side of each figure indicates a high-side p-type transistor (Q1, Q3). Also, the center of each figure indicates a guard region. Here, the manufacturing process flow for the guard region 4 will be shown, but the guard region 2 can be formed using a similar manufacturing process flow as well.

As shown in FIG. 10(A), a step of forming an oxide film (SO:SiO₂) on a p-type substrate (PSB) is performed. Next, as shown in FIG. 10(B), a photolithography step is performed, and a step of etching the oxide film (SO) in regions not covered by a resist is performed. Also, as shown in FIG. 10(C), using a step of introducing n-type ions into the p-type substrate (PSB), n-type buried layers (NB1, NB2) are formed in regions not covered by the oxide film (SO).

Next, as shown in FIG. 10(D), the oxide film (SO) is removed using an etching step, and a photolithography step is performed. Next, using a step of introducing p-type ions into the p-type substrate (PSB), a p-type buried layer (PB2) is formed in a region not covered by a resist. Then, as shown in FIG. 10(E), a step of forming a p-type epitaxial layer (PEPI) on the p-type substrate (PSB) and the buried layers (NB1, NB2, PB2) is performed.

As described above, the n-type buried layers (NB1, NB2) and the p-type buried layer (PB2) are formed under the p-type epitaxial layer (PEPI). That is to say, the n-type buried layers of the high-side and low-side transistors and the p-type buried layer of the guard region can be formed.

Figure 11B:
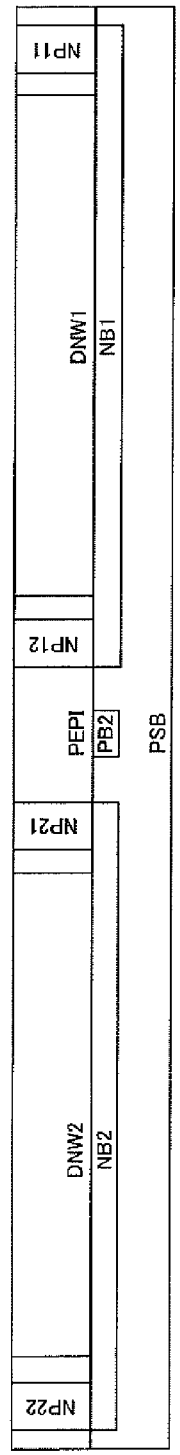

Next, as shown in FIG. 11(A), using a photolithography step and a step of introducing n-type ions into the p-type epitaxial layer (PEPI), deep n-type wells (DNW1, DNW2) are formed in regions not covered by a resist. Then, as shown in FIG. 11(B), using a photolithography step and a step of introducing n-type ions into the p-type epitaxial layer (PEPI), n-type plugs (NP11, NP12, NP21, NP22) are formed in regions not covered by a resist.

Figure 11C:
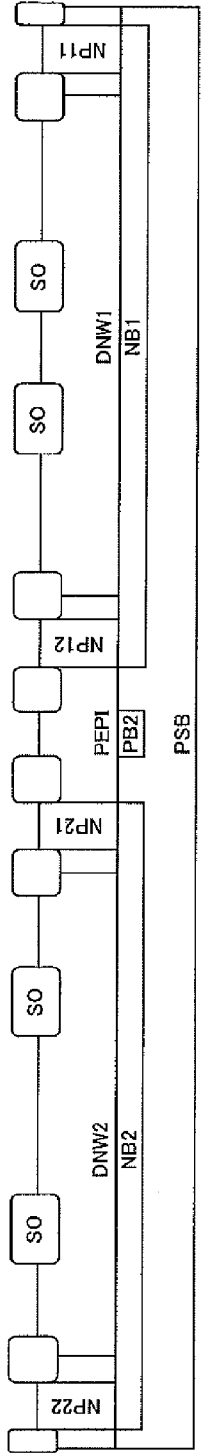
Figure 11D:
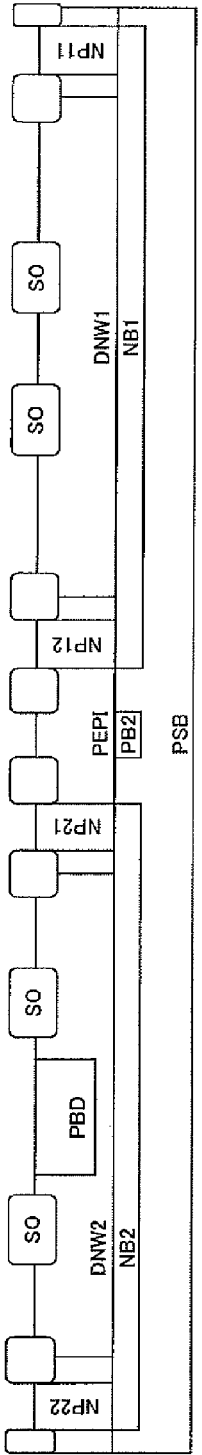

Next, as shown in FIG. 11(C), by performing a photolithography step and an etching step for a silicon nitride film and performing an oxide film forming step, LOCOS (SO) are formed. Then, as shown in FIG. 11(D), using a photolithography step and a step of introducing p-type ions into a deep n-type well (DNW2), a p-type body (PBD) is formed in a region not covered by a resist.

Figure 12A:
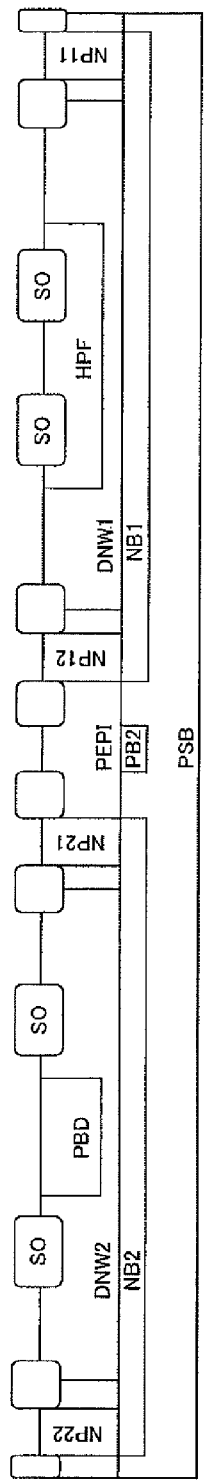
FIGS. 12A to 12C show a manufacturing process flow for a guard region and transistors having a DMOS structure.
Figure 12B:
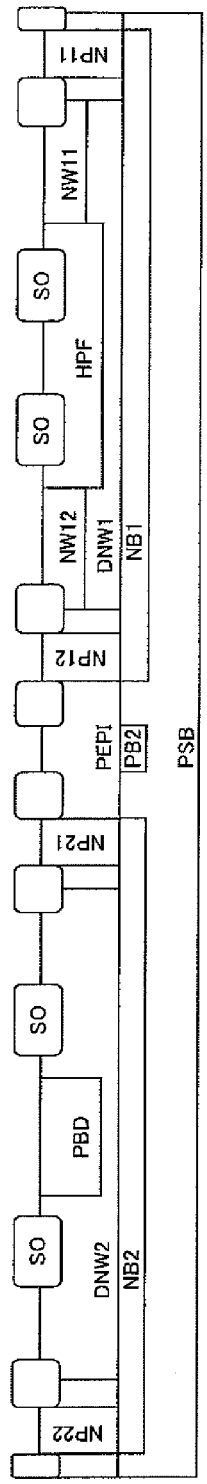
Figure 12C:
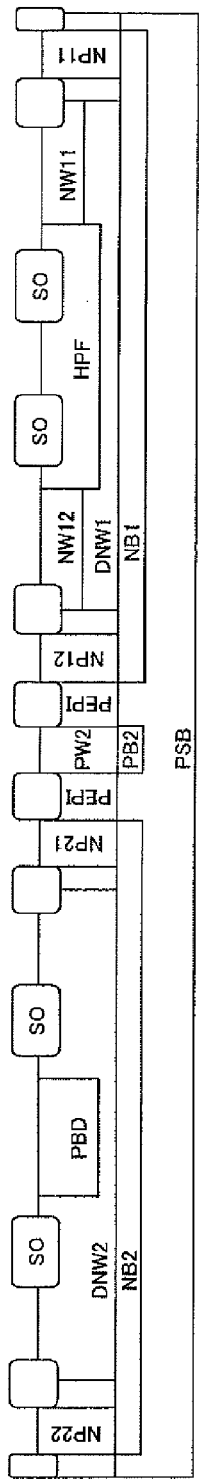

Next, as shown in FIG. 12(A), using a photolithography step and a step of introducing p-type ions into the deep n-type well (DNW1), a p-type impurity layer (HPF) is formed in a region not covered by a resist. Next, as shown in FIG. 12(B), using a photolithography step and a step of introducing n-type ions into the deep n-type well (DNW1), the low breakdown voltage n-type wells NW11 and NW12 are formed in regions not covered by a resist. Then, as shown in FIG. 12(C), using a photolithography step and a step of introducing p-type ions into the p-type epitaxial layer (PEPI), a low breakdown voltage p-type well (PW2) is formed in a region not covered by a resist. That is to say, a p-type well included in the guard region is formed.

As described above, in the present embodiment, the deep n-type wells (DNW1, DNW2) of the transistors in the bridge circuit 10 and the p-type wells (PW2, PW1) of the guard region are formed by introducing impurity ions into an epitaxial layer (PEPI) formed on n-type buried layers (NB1, NB2) and a p-type buried layer (PB2).

Figure 13A:
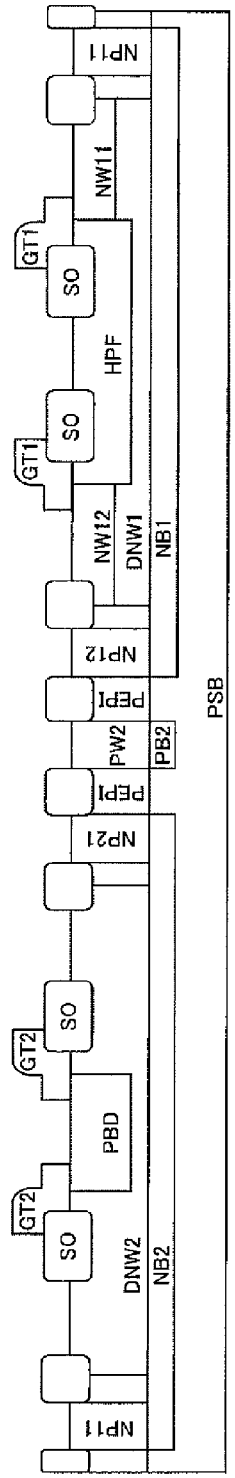
FIGS. 13A to 13C show a manufacturing process flow for a guard region and transistors having a DMOS structure.
Figure 13B:
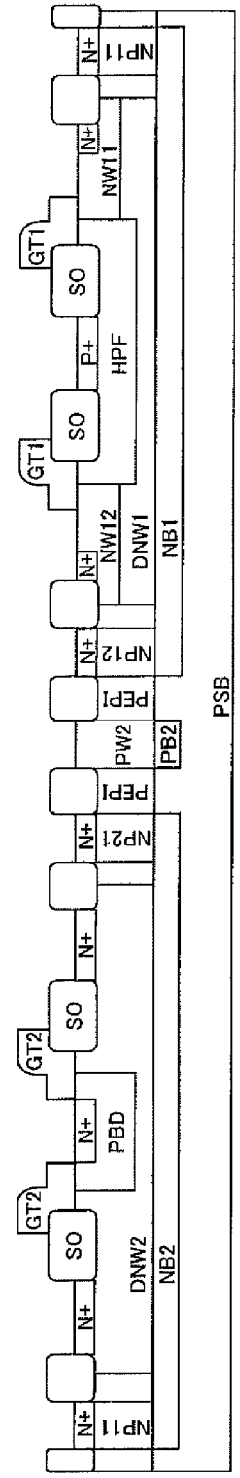
Figure 13C:
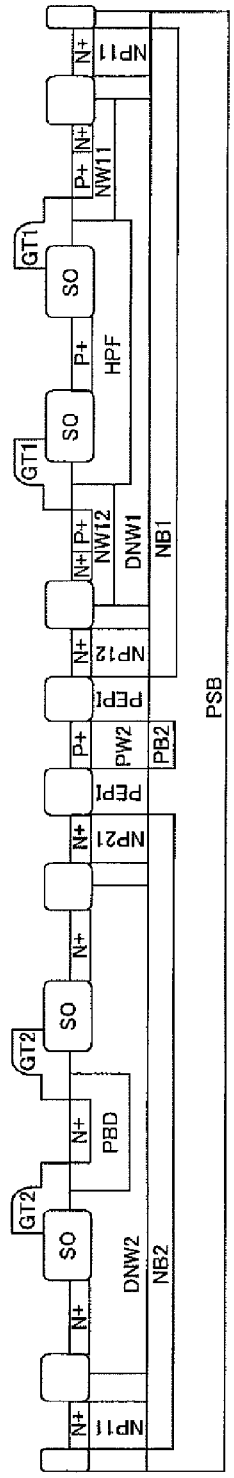

Next, as shown in FIG. 13(A), by performing a step of forming a polysilicon layer and performing a photolithography step and an etching step, gate layers (GT1, GT2) are formed. Next, as shown in FIG. 13(B), using a photolithography step and a step of introducing n-type ions, n-type impurity layers (N+) are formed in the substrate surface layer. The n-type impurity layers (N+) are sources, drains, or the like of the n-type transistors of the bridge circuit 10. Also, as shown in FIG. 13(C), using a photolithography step and a step of introducing p-type ions, p-type impurity layers (P+) are formed in the substrate surface layer. The p-type impurity layers (P+) are the source and drain of the p-type transistor in the bridge circuit 10 and the p-type impurity layer and the like of the guard region.

As described above, an n-type transistor having a DMOS structure (left side of drawing) and a p-type transistor having a DMOS structure (right side of drawing) that are part of the bridge circuit 10, and a guard region (center of drawing) are formed.

Note that the manufacturing process for the transistor with the CMOS structure was not described, but it is sufficient that layers in common with the transistor with the DMOS structure are formed using the same steps and a semiconductor substrate in which a CMOS structure and a DMOS structure are both present is formed using one manufacturing flow.

6. Electronic Apparatus

Figure 14:
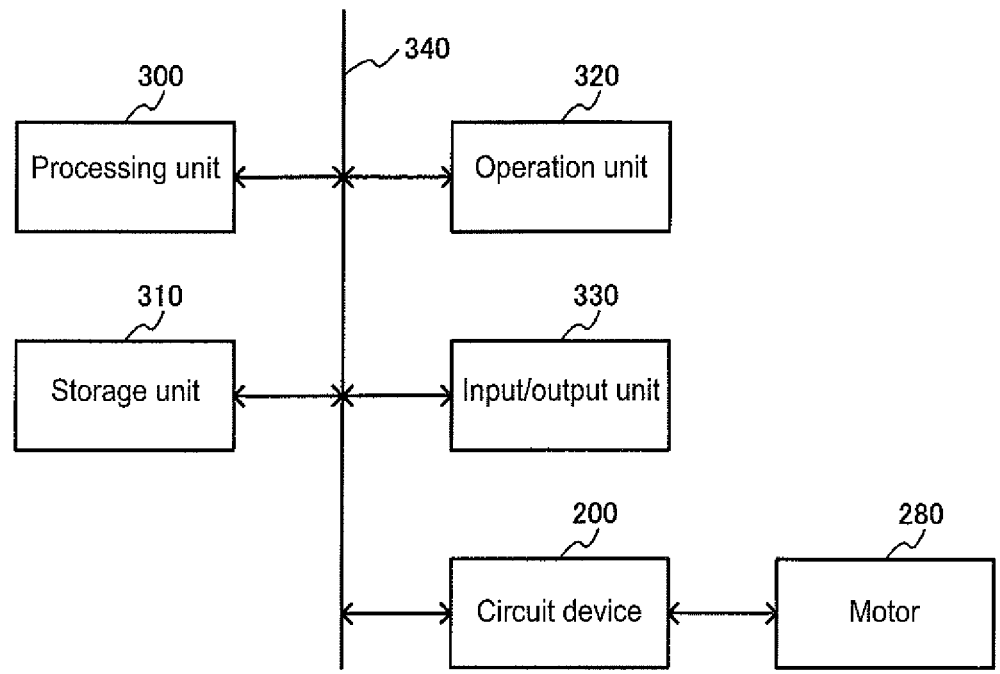
FIG. 14 shows an example of a configuration of an electronic apparatus.

FIG. 14 shows an example of a configuration of an electronic apparatus to which a circuit device 200 (motor driver) of the present embodiment has been applied. The electronic apparatus includes a processing unit 300, a storage unit 310, an operation unit 320, an input/output unit 330, the circuit device 200, a bus 340 connecting the units, and a motor 280. Hereinafter, a description will be given taking, as an example, a printer that controls a head and paper feeding using motor driving, but the present embodiment is not limited thereto, and the present invention can be applied to various types of electronic apparatuses.

The input/output unit 330 is constituted by an interface such as a USB connector or a wireless LAN, for example, and receives input of image data and document data. The input data is stored in the storage unit 310, which is an internal storage device such as a DRAM, for example. Upon receiving a print instruction from the operation unit 320, the processing unit 320 starts an operation of printing the data stored in the storage unit 310. The processing unit 300 sends an instruction to the circuit apparatus 200 (motor driver) along with the print layout of the data, and the circuit device 200 performs head movement and paper feeding by causing the motor 280 to rotate based on the instruction.

Note that although the present embodiment has been described above in detail, it should be apparent to a person skilled in the art that various modifications that do not stray substantially from the novelty and effects of the present invention are possible. Accordingly, these modifications are all intended to be encompassed in the scope of the present invention. For example, in the specification and the drawings, terms (p-type, n-type, etc.) written together with different terms that are more widely interpreted or have the same meaning (first conductivity type, second conductivity type) in at least one instance can be replaced with those different terms in all cases in the specification or the drawings. Also, all combinations of the present embodiment and the modifications are also included in the scope of the present invention. Also, the configuration, operation, and arrangement configuration of the circuit device, the structure of the transistor and the guard region, and the like are not limited to the description of the present embodiment, and can be implemented with various modifications thereto.

The entire disclosure of Japanese Patent Application No. 2014-027439, filed Feb. 17, 2014 is expressly incorporated by reference herein.

What is claimed is:

1. A circuit device comprising:
   a bridge circuit having a high-side transistor and a low-side transistor;
   a detection circuit configured to detect a current flowing in the bridge circuit;
   a control circuit configured to, based on the detection result from the detection circuit, control switching on and off of the high-side transistor and the low-side transistor;
   a guard region that is provided between the high-side transistor and the detection circuit, and between the low-side transistor and the detection circuit and is for setting a substrate of the circuit device to a substrate potential;
   wherein the high-side transistor of the bridge circuit comprises:
   a first n-type plug configured to supply a voltage to an n-type buried layer of the high-side transistor, wherein the first n-type plug is provided on one side of the high-side transistor; and
   a second n-type plug configured to supply a voltage to the n-type buried layer of the high-side transistor, wherein the second n-type plug is provided on an opposite side of the high-side transistor.

2. The circuit device according to claim 1, wherein the substrate is a first conductivity type substrate, and the guard region has a first conductivity type buried layer that is formed in the first conductivity type substrate, a first conductivity type well that is formed on the first conductivity type buried layer, and a first conductivity type impurity layer that is formed in the first conductivity type well.

3. The circuit device according to claim 2, wherein the first conductivity type well is a layer obtained by introducing a first conductivity type impurity into an epitaxial layer.

4. The circuit device according to claim 1, wherein the high-side transistor and the low-side transistor are transistors having a DMOS structure.

5. The circuit device according to claim 4, wherein the substrate is a first conductivity type substrate, and at least one of the transistors having the DMOS structure is formed above a second conductivity type buried layer that is formed in the first conductivity type substrate.

6. The circuit device according to claim 5, wherein the guard region has a first conductivity type buried layer.

7. The circuit device according to claim 4, wherein at least one of the transistors having the DMOS structure is formed in a second conductivity type deep well that is formed by an epitaxial layer on a second conductivity type buried layer.

8. The circuit device according to claim 7, wherein the guard region has a first conductivity type buried layer, a first conductivity type well formed by an epitaxial layer on the first conductivity type buried layer, and a first conductivity type impurity layer formed in the first conductivity type well.

9. The circuit device according to claim 1, further comprising a second guard region which is provided between the high-side transistor and the low-side transistor and is configured to set the substrate to the substrate potential.

10. The circuit device according to claim 1, wherein
the substrate is a p-type substrate,
the low-side transistor and the high-side transistor of the bridge circuit are transistors having a DMOS structure that are formed above a first n-type buried layer in the p-type substrate, and
the detection circuit comprises a transistor having a CMOS structure that is formed above a second n-type buried layer separate from the first n-type buried layer.

11. An electronic apparatus configured to include the circuit device according to claim 1.

12. An electronic apparatus configured to include the circuit device according to claim 2.

13. An electronic apparatus configured to include the circuit device according to claim 3.

14. An electronic apparatus configured to include the circuit device according to claim 4.

15. An electronic apparatus configured to include the circuit device according to claim 5.

16. An electronic apparatus configured to include the circuit device according to claim 6.

17. An electronic apparatus configured to include the circuit device according to claim 7.

18. An electronic apparatus configured to include the circuit device according to claim 8.

19. An electronic apparatus configured to include the circuit device according to claim 9.

20. An electronic apparatus configured to include the circuit device according to claim 10.

21. The circuit device according to claim 1, wherein the guard region comprises a p-type buried layer formed in the substrate, a p-type well formed in the p-type buried layer, a p-type impurity layer formed in the p-type well, and a metal layer electrically connected to the p-type impurity layer.

22. The circuit device according to claim 1, wherein
the high-side transistor and the low-side transistor of the bridge circuit form a parasitic diode and a parasitic capacitance in the circuit device,
the detection circuit is an analog detection circuit configured to detect a current flowing in the bridge circuit and whose detection results are adversely affected by noise generated by the parasitic diode and the parasitic capacitance, and
the depth of the guard region is equal to the depth of the analog detection circuit, thereby suppressing the entry of noise into the analog detection circuit generated by the parasitic diode and the parasitic capacitance of the bridge circuit.

* * * * *